US012750039B2

(12) United States Patent
Blin

(10) Patent No.: US 12,750,039 B2
(45) Date of Patent: Sep. 29, 2026

(54) FINE TRIMMING OF A RADIO FREQUENCY GAIN BY MODULATING THE PERIPHERY OF A RADIO FREQUENCY SWITCH

(71) Applicant: SKYWORKS SOLUTIONS, INC., Irvine, CA (US)

(72) Inventor: Guillaume Alexandre Blin, Carlisle, MA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 114 days.

(21) Appl. No.: 18/231,521

(22) Filed: Aug. 8, 2023

(65) Prior Publication Data

US 2024/0056056 A1 Feb. 15, 2024

Related U.S. Application Data

(60) Provisional application No. 63/397,493, filed on Aug. 12, 2022.

(51) Int. Cl.
*H03H 11/24* (2006.01)

(52) U.S. Cl.
CPC .................................. *H03H 11/245* (2013.01)

(58) Field of Classification Search
CPC ............. H03H 11/245; H03H 17/0054; H03H 2210/017
See application file for complete search history.

(56) References Cited

U.S. PATENT DOCUMENTS 10,193,520 B2 1/2019 Bergsma
10,382,003 B2 8/2019 Bergsma
10,396,735 B2 8/2019 Bergsma
10,651,816 B2 5/2020 Bergsma
10,756,688 B2 8/2020 Bergsma
2003/0184363 A1* 10/2003 Lopata ...................... G05F 3/24 327/544
2011/0148503 A1* 6/2011 Granger-Jones ..... H03H 11/245 327/308
2014/0009206 A1* 1/2014 Madan ................ H10D 86/201 327/379
2016/0085256 A1* 3/2016 Cam ...................... G05F 3/247 327/382
2017/0250723 A1* 8/2017 Srirattana ........... H03H 11/245

FOREIGN PATENT DOCUMENTS

EP 3012973 A1 * 4/2016 ........... H03H 11/245

* cited by examiner

*Primary Examiner* — Daniel C Puentes
(74) *Attorney, Agent, or Firm* — Lando & Anastasi, LLP

(57) ABSTRACT

A switched attenuator comprising a radio frequency input, a radio frequency output and an attenuation cell connected between the RF input and the RF output. The attenuation cell includes a variable switch with a variable on-resistance ($R_{on}$).

20 Claims, 17 Drawing Sheets

FINE TRIMMING OF A RADIO FREQUENCY GAIN BY MODULATING THE PERIPHERY OF A RADIO FREQUENCY SWITCH

CROSS-REFERENCE TO RELATED APPLICATIONS

This application claims priority under 35 U.S.C. § 119(e) to U.S. Provisional Patent Application Ser. No. 63/397,493, titled "FINE TRIMMING OF A RADIO FREQUENCY GAIN BY MODULATING THE PERIPHERY OF A RADIO FREQUENCY SWITCH," filed Aug. 12, 2022, the entire content of which is incorporated herein by reference in its entirety for all purposes.

BACKGROUND

Technological Field

The disclosure generally relates to radio frequency (RF) electronic systems and, in particular, to integrated circuits, modules, and methods for fine trimming upon attenuation.

Description of the Related Technology

Attenuators generally reduce the power of a signal, such as an electromagnetic or a radio frequency signal, without substantially distorting a waveform of the signal. Attenuators may be fixed attenuators that provide a constant level of attenuation or adjustable attenuators that may be configurable between multiple levels of attenuation. Adjustable multi-step attenuators are, for instance, formed by cascading multiple attenuation cells. Individual attenuation cells or stages are either selected or bypassed to achieve given or varying total attenuation levels. For fine trimming, a typical attenuator architecture requires very small resistances to perform fine gain adjustment, which are hard to implement and/or control.

SUMMARY

The systems, methods and devices of this disclosure each have several innovative aspects, no single one of which is solely responsible for the desirable attributes disclosed herein.

According to an aspect of the present disclosure, a switched attenuator is provided. The switched attenuator comprises a radio frequency (RF) input, an RF output, and an attenuation cell connected between the RF input and the RF output and including a variable switch with a variable on-resistance ($R_{on}$).

In one embodiment, the variable switch is connected in a series configuration or a shunt configuration between the RF input and the RF output.

In another embodiment, the variable switch is configured for fine trimming an insertion loss (IL) of the variable switch.

In a further embodiment, the attenuation cell comprises an attenuation network, the attenuation network optionally comprising at least one of a PI-network, a T-network, and a bridged T-network. In accordance with an aspect of this embodiment, the attenuation network comprises two impedances connected in series between input and output terminals of the attenuation network.

In one embodiment, the attenuation network further comprises a bridge impedance connected between the input and the output terminals of the attenuation network. In this embodiment, the two series connected impedances and the bridge impedance are connected in parallel between the input and the output terminals of the attenuation network. In another embodiment, the attenuation network comprises a shunt impedance coupled between the two series connected impedances. In accordance with another aspect of this embodiment, the variable switch is connected between input and output terminals of the attenuation network.

In another embodiment, the variable switch comprises a stack of one or more FETs. In accordance with one aspect of this embodiment, at least one of the one or more FETs comprises a variable on-resistance forming the variable on-resistance ($R_{on}$) of the variable switch.

In another embodiment, the variable switch comprises a stack of a plurality of FETs. In accordance with an aspect of this embodiment, each of at least two of the plurality of FETs comprises a variable on-resistance forming, at least in part, the variable on-resistance ($R_{on}$) of the variable switch. In accordance with a further aspect, one of the plurality of FETs has a fixed on-resistance forming, at least in part, the variable on-resistance ($R_{on}$) of the variable switch. In accordance with another aspect of this embodiment, the variable on-resistance ($R_{on}$) of the variable switch is equal to a sum of the on-resistance of each of the plurality of FETs.

In accordance with another aspect of the present disclosure, a method of controlling a switched attenuator comprising a radio frequency (RF) input, a RF output, and an attenuation cell connected between the RF input and the RF output is provided. The attenuation cell includes a variable switch with a variable on-resistance ($R_{on}$) and the method comprises fine trimming an insertion loss (IL) of the variable switch.

In accordance with another aspect of the present disclosure, a mobile device including a switched attenuator is provided. The attenuator comprises a radio frequency (RF) input, an RF output, and an attenuation cell connected between the RF input and the RF output and including a variable switch with a variable on-resistance ($R_{on}$).

BRIEF DESCRIPTION OF THE DRAWINGS

Embodiments of this disclosure will now be described, by way of non-limiting example, with reference to the accompanying drawings.

DETAILED DESCRIPTION

Figure 1:
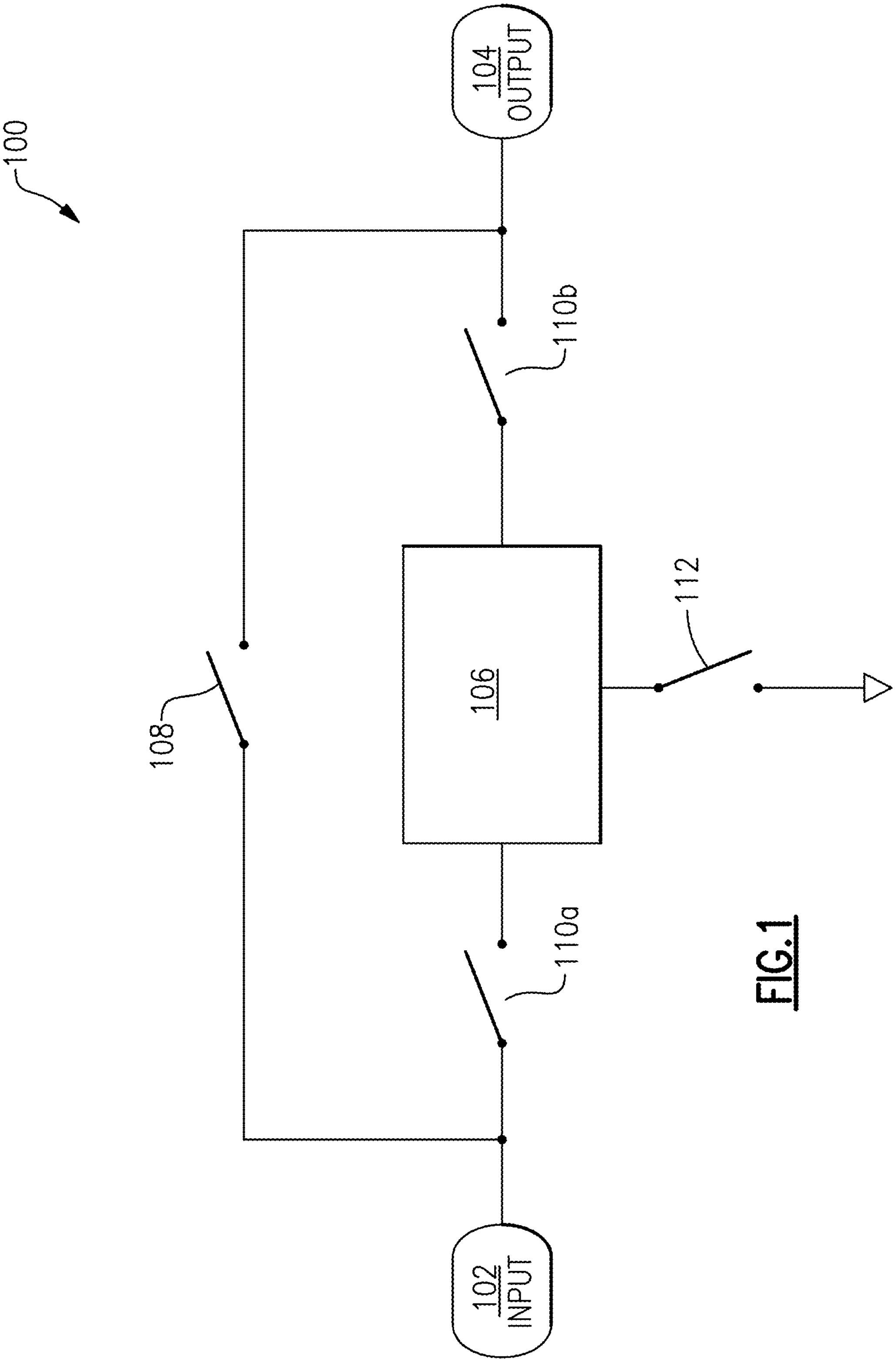
FIG. 1 is a schematic circuit diagram of an example attenuation cell.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The present disclosure addresses issues in radio-frequency (RF) switches in which the on-resistance ($R_{on}$) of a switch, ideally, an already existing switch in an RF chain, is altered to change the insertion loss of the switch. Attenuation is affected by reducing the width (also referred to as periphery) of a number of field effect transistors (FETs). The periphery of each FET inside a stack is independently trimmed to provide more states with less complexity in terms of eased control and number of components. Some of the inventive aspects disclosed herein enable minimum layout increase, broadband response, no need for small value resistors typically required for small attenuation steps, and negligible change in output return loss. In other words, an area efficient way of trimming for gain or attenuation is provided. Such a trimming block is of a compact size. Trimming may, for example, be advantageous to bring a device into accordance with the gain specification of an RF amplifier product at a final test, or the value of attenuation steps into a digitally switched attenuator (DSA).

FIG. 1 illustrates an example attenuation cell 100 constructed to receive an input signal and provide an output signal. As illustrated in FIG. 1, the attenuation cell 100 receives the input signal at an attenuation cell input 102 and provides the output signal at an attenuation cell output 104. It is appreciated that the attenuation cell 100 may be symmetrical and, thereby, receive the input signal at either port and still function in the same manner.

The attenuation cell 100 may include an attenuation network 106 coupled in parallel with a bypass switch 108 and coupled to the signal path by one or more attenuation switches 110. The attenuation network 106 may include a shunt terminal connected to a shunt switch 112. Depending upon the attenuation network 106 and in various embodiments, additional shunt terminals may be connected to additional shunt switches.

The attenuation cell 100 may operate in an attenuation mode by closing the attenuation switches 110*a*, 110*b* (i.e., conducting), and opening the bypass switch 108 (i.e., non-conducting), resulting in an input signal being directed through the attenuation network 106, which will reduce a power level of the input signal by action of the attenuation network 106. In embodiments, the shunt terminal of the resistive attenuation 106 is coupled to ground through the shunt switch 112 in a closed (conducting) state.

The attenuation cell 100 may operate in a bypass mode by closing bypass switch 108 to bypass the attenuation network 106 and provide an output signal that is substantially the same as the input signal.

In the example illustrated in FIG. 1, there are two attenuation switches 110 and one shunt switch 112 connected to the attenuation network 106. The switches 110*a*, 110*b* connect the attenuation network 106 to the attenuation cell input 102 and the attenuation cell output 104. The shunt switch 112 connects a third terminal of the attenuation network 106 to a reference node, which is a ground reference potential in the example of FIG. 1 but could be an alternate potential or a floating potential.

The switches 110 and shunt switch 112 isolate the attenuation network 106 from the remainder of the attenuation cell 100 when open (i.e., non-conducting), and thereby remove the attenuation network 106 from the signal path when the attenuation cell 100 is in bypass mode or in an isolated (i.e., open circuit) mode. Further, by isolating the attenuation network 106 from the signal path, parasitic losses caused by the attenuation network 106 are reduced when operating in bypass mode.

The bypass switch 108, the attenuation switches 110, and the shunt switch 112 may be constructed in a variety of manners depending upon the particular implementation. Any of the bypass switch 108, the attenuation switches 110, and the shunt switch 112 may be implemented as a single transistor or other component capable of being selectively placed in a conducting state or a non-conducting state. A transistor, such as a Field Effect Transistor (FET), a Bipolar Junction Transistor (BJT), or others, may be a suitable component. Additionally, in embodiments, other elements may be used, such as Microelectromechanical System (MEMS) switches, diodes, diode connected transistors, PIN diodes, etc. In embodiments, multiple components may be connected together to form any of the bypass switch 108, the attenuation switches 110, and the shunt switch 112.

Figure 2A:
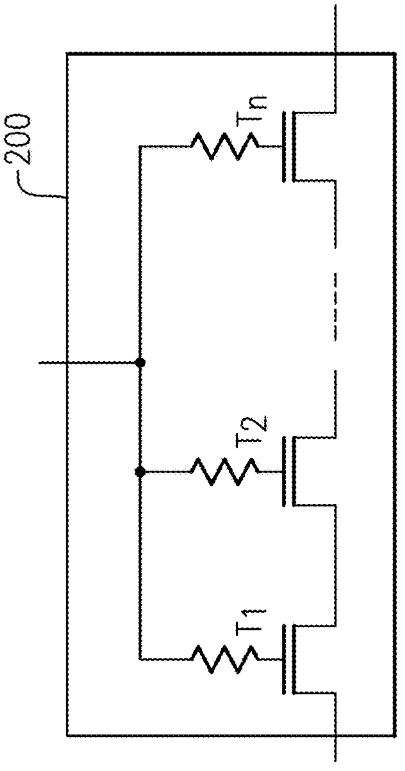
FIG. 2A and FIG. 2B are schematic circuit diagrams of examples of RF switches.
Figure 2B:
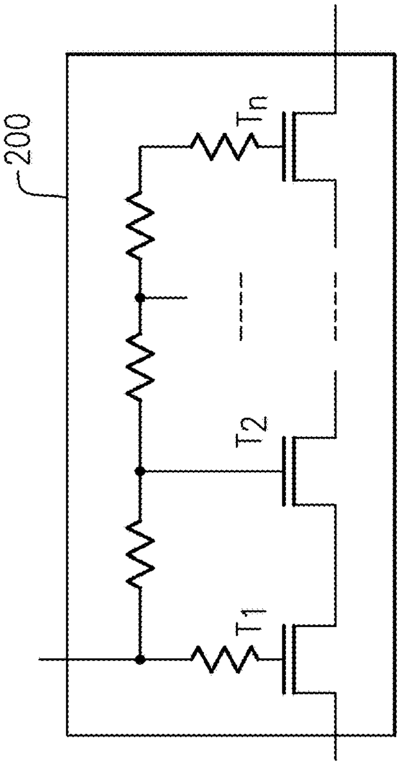

In FIG. 2A to FIG. 2B, examples of a switch 200 are constructed by connecting a plurality of Field Effect Transistors T1-Tn in series. The plurality of series-connected transistors, as opposed to a single transistor, may provide additional isolation when off (non-conducting) than may be provided over fewer transistors or by only one transistor. Additionally, a plurality of transistors in series may accommodate a higher input power as the signal voltage level is distributed across more transistors, reducing the possibility of voltage breakdown in any of the transistors, when necessary. A plurality of transistors will also improve the linearity of the attenuation cell in both bypass and isolation state. Also shown in FIG. 2A to FIG. 2B is that the transistor gates are tied together to form a control input such that a control voltage applied to any of the gates is effectively applied to all the gates, thereby controlling the conducting or non-conducting state of the transistors. Additionally as shown, the gates of the individual transistors may be tied together via gate resistances, either as individual gate resistances, such as in FIG. 2A, or as additive series gate resistances, as in FIG. 2B, or any combination of these or other arrangements. Additionally, in embodiments, two or more of the gates may be directly electrically tied to each other without a resistance between them. Any of the bypass switch 108, the attenuation switches 110, and the shunt switch 112 may be formed from the example switch 200 or variations thereof.

The attenuation switches 110 and other elements may themselves attenuate the input signal in addition to the attenuation applied by the attenuation network 106 while in attenuation mode. Accordingly, the attenuation provided by the attenuation network 106 may be designed to be slightly lower than the total desired attenuation to compensate for attenuation introduced by other elements, such as the switches. An aspect of at least one embodiment includes matching, or balancing, the impact of the bypass switch 108 with the impact of the attenuation switches 110 and/or shunt switch 112 so that the difference in attenuation produced by the attenuation mode as compared to the bypass mode is due solely to the attenuation network 106. In other words, when the attenuation cell 100 is switched from bypass mode to attenuation mode, or vice versa, a precise change in the attenuation level will result and is due substantially solely to the attenuation of the attenuation network 106.

As described above, the attenuation cell 100 may include a resistive network 106 to attenuate the input signal when the attenuation cell 100 is in the attenuation mode of operation. Various types of attenuation networks 106 may be employed depending upon the particular implementation. For example, the attenuation network 106 may include a number of options for an attenuator network or circuit topology, as described further below, and elemental values, such as resistance values, may be selected to provide any of numerous attenuation levels, such as, for example, ½ dB, 1 dB, 2 dB, 3 dB, 4 dB, 6 dB, 9 dB, etc.

Figure 6:
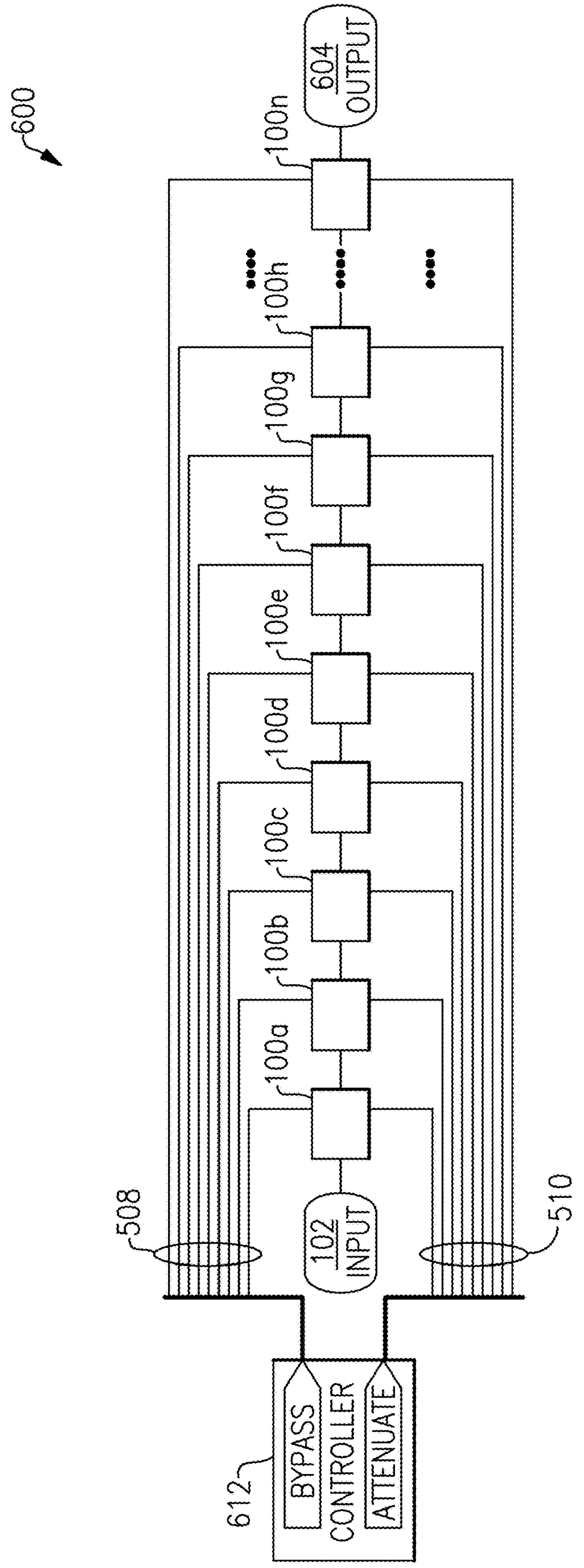
FIG. 6 is a block diagram of a multi-cell digital switched attenuator.

In embodiments, multiple attenuation cells 100 are coupled together, e.g., in series, as in the digital switched attenuator 600 of FIG. 6, and may provide a variable attenuation level by controlling the individual attenuation cells 100 to be in attenuation mode or in bypass mode as discussed above. Further, the digital switched attenuator 600 may be open-circuited by controlling at least one attenuation cell 100 to be in an isolated mode, i.e., open-circuited, by having its bypass switch 108 and at least one of its attenuation switches 110*a* or 110*b* in an open (non-conducting) state, so that no signal path is formed between the attenuation cell input 102 and the attenuation cell output 104.

Further, individual attenuation cells 100 include a network 106 that may be a fixed attenuator providing a single constant level of attenuation, a multi-step attenuator configurable between a pre-defined set of attenuation levels, or a variable attenuator that is configurable within a continuous range of attenuation levels.

Figure 3A:
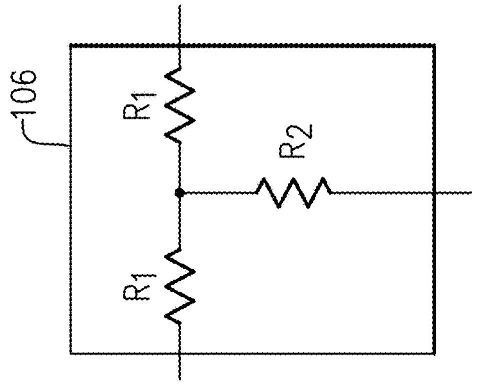
FIG. 3A to FIG. 3D are schematic circuit diagrams of examples of attenuation networks.
Figure 3B:
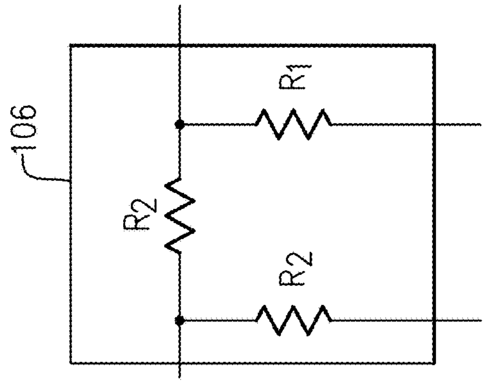
Figure 3C:
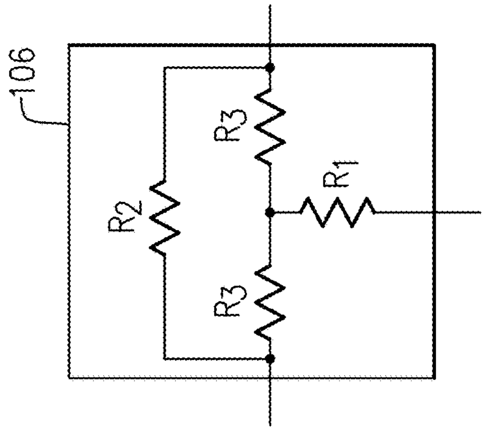

FIG. 3A to FIG. 3C illustrate examples of fixed attenuator circuits suitable to employ as attenuation network 106. FIG. 3A illustrates a T-network circuit topology, FIG. 3B illustrates a Pi-network circuit topology, and FIG. 3C illustrates a Bridged T-network circuit topology. The attenuation network 106 may be implemented as one or more of the circuit topologies shown in FIG. 3A to FIG. 3C, or may be variations or equivalent circuits of the circuit topologies shown in FIG. 3A to FIG. 3C, or may be implemented as other circuit topologies. The impedance elements of the circuit topologies shown in FIG. 3A to FIG. 3C, e.g., impedances $R_1$, $R_2$, and $R_3$, may be implemented as pure resistances as shown or may include inductive or capacitive elements in various embodiments.

In at least one embodiment, the bridged T-network of FIG. 3C is used as the model for an attenuation network 106. The bridged T-network of FIG. 3C includes two impedances $R_3$ connected in series between the input and the output terminals, a shunt impedance $R_1$ coupled between the two series connected impedances $R_3$ and a third terminal, and a bridge impedance $R_2$ coupled between the input and the output, in parallel with the series connected impedances $R_3$. The values for the impedances $R_1$, $R_2$, and $R_3$ may be determined based on the relationships illustrated in equations (1) below given a desired attenuation level A in dB and a desired characteristic impedance $Z_0$:

$$R_1 = \frac{Z_0}{\sqrt{\frac{A}{10^{10}-1}}};\ R_2 = Z_0 \times \left(\sqrt{10^{\frac{A}{10}}} - 1\right);\ R_3 = Z_0 \tag{1}$$

Table 1 illustrates example values for the impedances $R_1$, $R_2$, and $R_3$ achieve various attenuation steps in a bridged-T attenuation network 106 as described above with reference to FIG. 3C, using equations (1) and assuming a desired characteristic impedance $Z_0$=50Ω.

TABLE 1

| Total Attenuation Step dB | Calculated $R_1$ Shunt Values Ω | Calculated $R_2$ Bridge Values Ω | $R_3$ Values ($R_3 = Z_0$) Ω |
|---|---|---|---|
| ½ | 843.8 | 2.96 | 5 |
| 1 | 409.8 | 6.10 | 50 |
| 2 | 193.1 | 12.95 | 50 |
| 3 | 121.2 | 20.63 | 50 |
| 4 | 85.49 | 29.24 | 50 |
| 6 | 50.24 | 49.76 | 50 |
| 9 | 27.50 | 90.92 | 50 |

Figure 3D:
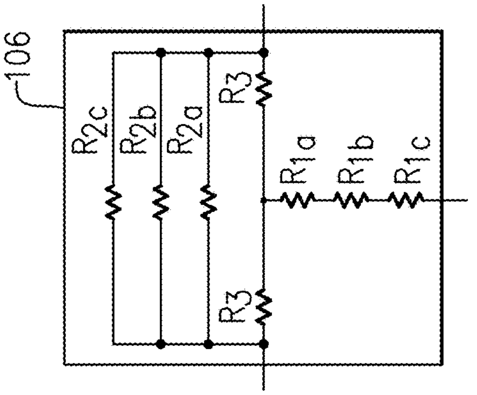

The impedances $R_1$, $R_2$, and $R_3$ for each attenuation cell 100, in relation to the attenuation network 106 of FIG. 3C and values of Table 1, may be established by a variety of methods depending upon the particular implementation. For example, with reference to FIG. 3D, multiple impedances connected in parallel or in series may replace one or more of the single impedances $R_1$, $R_2$, and $R_3$. This approach may be advantageous because it may avoid the use of small impedance values, which generally are more difficult to manufacture with tight tolerances and/or may require more space. With reference to Table 1, attenuators with low attenuation levels, e.g., ½ dB, 1 dB, include relatively high values for $R_1$ and relatively low values for $R_2$. Accordingly, the attenuation network 106 of FIG. 3D is shown with series-connected impedances $R_{1a}$, $R_{1b}$, and $R_{1c}$ that yield an additive total value of $R_1$, allowing the component values of $R_{1a}$, $R_{1b}$, and $R_{1c}$ individually to be smaller while achieving a larger value for $R_1$ overall. Comparably, the attenuation network 106 of FIG. 3D is shown with parallel-connected impedances $R_{2a}$, $R_{2b}$, and $R_{2c}$ that yield a value of $R_2$ lower than any of $R_{2a}$, $R_{2b}$, and $R_{2c}$ individually. This approach allows fabrication of impedances $R_1$ and $R_2$ (for example, in an integrated circuit) from multiple individual impedances (e.g., $R_{1a}$, $R_{1b}$, $R_{1c}$, $R_{2a}$, $R_{2b}$, and $R_{2c}$) that may allow for more precise and/or more consistent impedances $R_1$ and $R_2$ in the face of manufacturing process variation.

For example, for a desired characteristic impedance $Z_0$=50Ω, a manufacturing process may be capable of reliably producing a resistive impedance of 50Ω, which may reliably produce the impedance $R_3$ for any attenuation level of the attenuation cells 100, as shown in Table 1. With reference to the 1 dB values from Table 1, the impedance $R_1$ is approximately eight times (8×) the value of impedance $R_3$, and the impedance $R_2$ is approximately one-eighth (⅛×) the value of impedance $R_3$. Using the circuit topology of FIG. 3D, the impedances $R_1$ and $R_2$ of FIG. 3C may be more reliably produced for a 1 dB attenuation cell by forming $R_1$ from 8 resistors of 50Ω each connected in series and forming $R_2$ from 8 resistors of 50Ω each connected in parallel. More generally, fabricating multiple 50Ω resistors in parallel or in series may be more accurate than fabricating individual resistors of, for example, 25Ω or less and 100Ω or more. Additionally, and as in the 1 dB example, the desired impedances $R_1$ and $R_2$ may not be exact integer values of $R_3$ or another component impedance, but manufacture of multiple component impedances of similar or approximately the same values, though not exactly the same value, will generally yield a more consistent set of equivalent impedances, resulting in an attenuation network 106 design that is more immune to process variation during manufacture.

While the attenuation network 106 of FIG. 3D is shown with three component impedances $R_{1a}$, $R_{1b}$, and $R_{1c}$ contributing to impedance $R_1$ and three component impedances $R_{2a}$, $R_{2b}$, and $R_{2c}$ contributing to impedance $R_2$, it is understood that the example discussed, and various embodiments, may include more or fewer component impedances for any particular impedance and any particular design of the attenuation network 106. In particular, an attenuation network 106 may be designed for virtually any desired attenuation level from virtually any available set of component impedances R by applying the aspects and relationships described above.

In at least one embodiment of an attenuation network 106, the impedances $R_1$, $R_2$, and $R_3$ are designed to be resistances, as shown, without any intentional reactive component. Accordingly, such an attenuation network 106 may be substantially frequency independent.

Figure 4A:
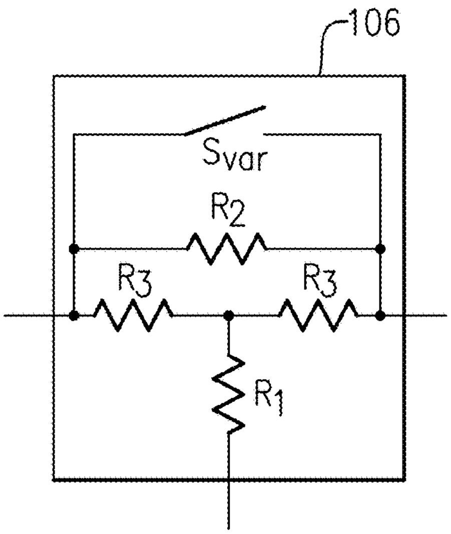
FIG. 4A and FIG. 4B are schematic circuit diagrams of examples of resistive networks having a variable switch.
Figure 4B:
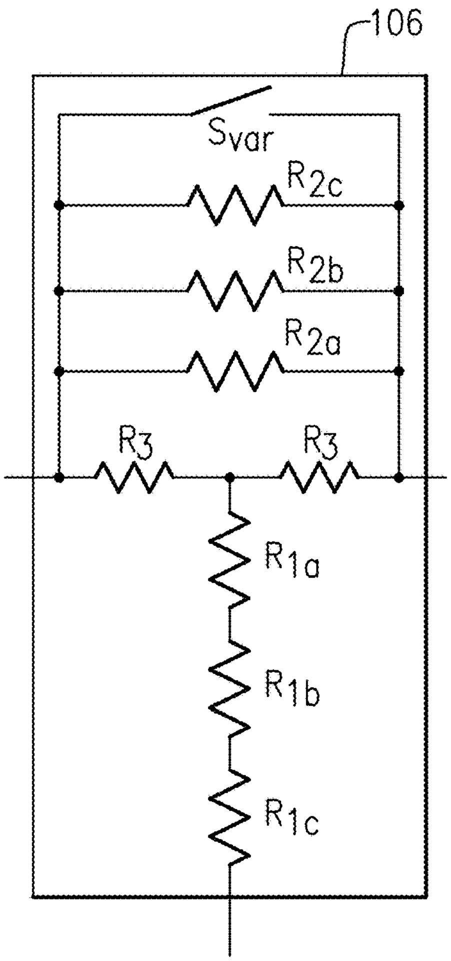
Figure 4D:
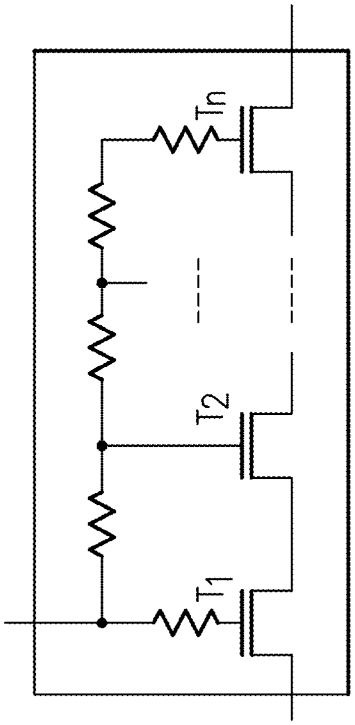
FIG. 4C and FIG. 4D are schematic circuit diagrams of examples of a stack of field effect transistors of a variable switch.
Figure 4C:
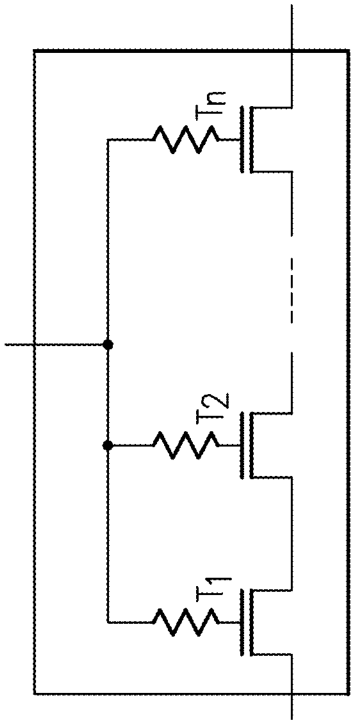

FIG. 4A and FIG. 4B illustrate examples of the schematic circuit diagrams of FIG. 3C and FIG. 3D having a variable switch (Svar) to fine trim the insertion loss in bypass mode. The variable switch may be implemented in terms of an additional bypass FET that may be a stack of one or more FETs or in terms of a previous bypass FET being a stack of a plurality of FETs, e.g., 3 FETs, as illustrated in FIG. 4C and FIG. 4D.

The variable switch may, however, also be implemented as a single variable switch ($S_{var}$) only that is a variable resistor when on and a capacitance when off. The variable switch may be used by itself, without any attenuator built around it. The variable switch can be used to trim a gain or a loss of an RF path by itself. The variable switch can be simplified to a trimmable series FET (series configuration), the insertion loss of which providing programmable attenuation. In another embodiment the trimmable FET can be placed in series with a shunt resistive element within a shunt branch to alter the overall loss of the shunt branch and as such the insertion loss of the RF path (shunt branch configuration). The variable switch itself may be considered an attenuation cell (cf. FIG. 1), where the variable switch is, for instance, in a series configuration or in a shunt branch configuration.

The approximate on-resistance for a metal oxide semiconductor (MOS) FET may generally be expressed as $$R_{on} = \frac{1}{\mu C_{ox}\frac{W}{L_{eff}}(V_{gs} - V_t)} \tag{2}$$

where μ denotes the electron mobility, $C_{ox}$ denotes the gate oxide capacitance, $L_{eff}$ denotes the effective gate length, $V_{gs}$ denotes the gate bias voltage, and $V_t$ denotes the device threshold.

Insertion loss for the variable switch $S_{var}$, which in an example configuration, may be bypassing a bridge T attenuator as illustrated in FIG. 4A, may be expressed as $$IL = -20\log\left(\frac{2Z_0}{2Z_0 + R_{on}}\right) \tag{3}$$

Attenuation is affected by insertion loss and, thus, by reducing the FET periphery. The periphery of each FET may be independently trimmed inside a stack to provide more attenuation states without necessarily adding further complexity in terms of adding a more complex resistive network, for instance adding multiple smaller attenuation steps with very low values (for instance 0.05 dB, 0.1 dB, 0.2 dB).

In the following, 3 stacked FETs are considered, as an example implementation for the variable switch $S_{var}$ bypassing the bridge T attenuator of FIG. 4A. Formally, the variable switch $S_{var}$ may thus be written as a sum $$S_{var} = S_{fix}^0 + S_{var}^1 + S_{var}^2.$$

For purpose of simplification, the embodiment where $$S_{fix}^0$$

is fixed is presented but in other embodiments $$S_{fix}^0$$

could be variable as well, $$S_{var}^0.$$

The example implementation is not limiting. The variable switch $S_{var}$ can be used to trim a gain or a loss of an RF path by itself, without any attenuator built around it. The variable switch can also be used in any network including PI, Tee, Bridge Tee or other implementations.

By adjusting 2 of the 3 stacked FETs, where each of said 2 adjustable FETs may, for instance, have 2 states, e.g., 4 attenuation states with minimum overhead $R_{on}$ can be produced where $R_{on}$ denotes the on-resistance of $S_{var}$. The on resistance $R_{on}$ may, for example, be given by equation (4)

$$R_{on} = R_{fix}^0 + R_{var}^1 + R_{var}^2 \tag{4}$$

where $$R_{fix}^0$$

denotes the fixed on-resistance of the first FET $$S_{fix}^{0} \text{ and } R_{var}^{1} \text{ and } R_{var}^{1}$$

denote the variable on-resistance of the 2 adjustable FETs $$S_{var}^{1}, \text{ and } S_{var}^{2}.$$

Table 2 illustrates example values for the on-resistances $$R_{fix}^{0}, R_{var}^{1}, R_{var}^{2}, \text{ and } R_{on} \text{ of } S_{fix}^{0}, S_{var}^{1}, S_{var}^{2},$$

and $S_{var}$, respectively, to achieve various attenuation steps in a bridged-T attenuation network 106 as described above with reference to FIG. 4A, using equations (1) and (2) and assuming a desired characteristic impedance $Z_0=50\Omega$.

TABLE 2

| $R_{varfix}^{0}$ Ω | $R_{var}^{1}$ Ω | $R_{var}^{2}$ Ω | $R_{on}$ Ω | $R_{on}/R_p$[d] | IL dB | ΔIL dB |
|---|---|---|---|---|---|---|
| 1.39[a] | 1.39[a] | 1.39[a] | 4.2 | 3.8 | 0.32 | 0.00 |
| 1.39[a] | 1.39[a] | 5.85[b] | 8.6 | 7.1 | 0.60 | 0.28 |
| 1.39[a] | 9.8[c] | 1.39[a] | 12.6 | 9.6 | 0.80 | 0.48 |
| 1.39[a] | 9.8[c] | 5.85[b] | 17.0 | 12.1 | 0.99 | 0.67 |

[a,b,c]Number of fingers: 42, 10, and 6 respectively.
[d]$R_p$ = 41.17 Ω in this example.

The insertion loss IL resulting from the configurations of the 3 FETs $$\left(R_{fix}^{0}, R_{var}^{1}, R_{var}^{2}\right)$$

in parallel with the equivalent impedance $R_p$ resulting from the attenuation network ($R_2$ in parallel with $R_3+R_3$ in the case of FIG. 4A) as well as the difference of the insertion loss ΔIL with respect to the bypass state (lowest insertion loss state where all transistors are ON) are also summarized in Table 2. The superscript of the values of the impedances $$R_{fix}^{0}, R_{var}^{1}, \text{ and } R_{var}^{2}$$

refers to the number of fingers of the respective FET to achieve the on-resistances $$R_{fix}^{0}, R_{var}^{1}, \text{ and } R_{var}^{2},$$

respectively.

One limitation of the example with 2 adjustable FETs $$S_{var}^{1}, \text{ and } S_{var}^{2}$$

described above is that $$S_{var}^{1}$$

has a high on-resistances $$R_{var}^{1}$$

in the insertion loss state (cf. Table 2, on resistance of 9.8Ω, with 6 fingers), which decreases the power handling and linearity (measure of signal distortion) of the switch and thus the power handling and linearity of the trimming stage and RF chain. Therefore, in an alternative, a resistance change can not only be applied to $$S_{var}^{1}$$

but also to $$S_{fix}^{0},$$

each only varying from 1.39Ω, to 5.85Ω, while being controlled by the same control signal Therefore, $$S_{fix}^{0}$$

effectively becomes variable, $$S_{var}^{0}.$$

Table 3 illustrates, for the alternative solution having a variable switch $$S_{var}^{0},$$

example values for the on-resistances $$R_{var}^{0}, R_{var}^{1}, R_{var}^{2},$$

and $R_{on}$ of $$S_{var}^{0}, S_{var}^{1}, S_{var}^{2},$$

and $S_{var}$, respectively, to achieve attenuation steps in a bridged-T attenuation network 106 as described above with reference to FIG. 4A, using equations (1) and (2) and assuming a desired characteristic impedance $Z_0=50\Omega$.

TABLE 3

| $Rv_{fix}^{0}$ Ω | $R_{var}^{1}$ Ω | $R_{var}^{2}$ Ω | $R_{on}$ Ω | $R_{on}/R_p^{c}$ | IL dB | ΔIL dB |
|---|---|---|---|---|---|---|
| $1.39^{a}$ | $1.39^{a}$ | $1.39^{a}$ | 4.2 | 3.8 | 0.32 | 0.00 |
| $1.39^{a}$ | $1.39^{a}$ | $5.85^{b}$ | 8.6 | 7.1 | 0.60 | 0.28 |
| $5.85^{b}$ | $5.85^{b}$ | $1.39^{a}$ | 12.6 | 9.9 | 0.82 | 0.50 |
| $5.85^{b}$ | $5.85^{b}$ | $5.85^{b}$ | 17.0 | 12.3 | 1.01 | 0.69 |

[1,2]Number of fingers: 42 and 10, respectively.

[c]$R_p$ = 41.17 Ω in this example.

The insertion loss IL resulting from the configurations of the 3 variable FETs $$\left(R_{var}^{0}, R_{var}^{1}, R_{var}^{2}\right)$$

in parallel with the equivalent impedance $R_p$ resulting from the attenuation network ($R_2$ in parallel with $R_3$+$R_3$ in the case of FIG. 4A) as well as the difference of the insertion loss ΔIL with respect to the bypass state (lowest insertion loss state where all transistors are ON) are also summarized in Table 3. The superscript of the values of the impedances $$R_{var}^{0}, R_{var}^{1}, \text{ and } R_{var}^{2}$$

refers to the number of fingers of the respective FET to achieve the on-resistances $$R_{var}^{0}, R_{var}^{1}, \text{ and } R_{var}^{2},$$

respectively.

The gain trimming approach relies on changing $R_{on}$. Instead of or in addition to modulating the FET periphery by switching a FET in and out, the gate voltage of some or all of this FET could be adjusted as Equation 2 denotes the relationship between insertion loss and Vgs. It is a benefit of the switched approach that the device is biased in its optimized on/off conditions where power handling and linearity are optimized and well modeled.

The concept of fine trimming by means of a switch can be applied using any semiconductor technology, Silicon, CMOS, SOI, SiGe, SOS, compound semiconductors like GaAs or GaN, even using MEMS-based or phase-change based switches.

Figure 5:
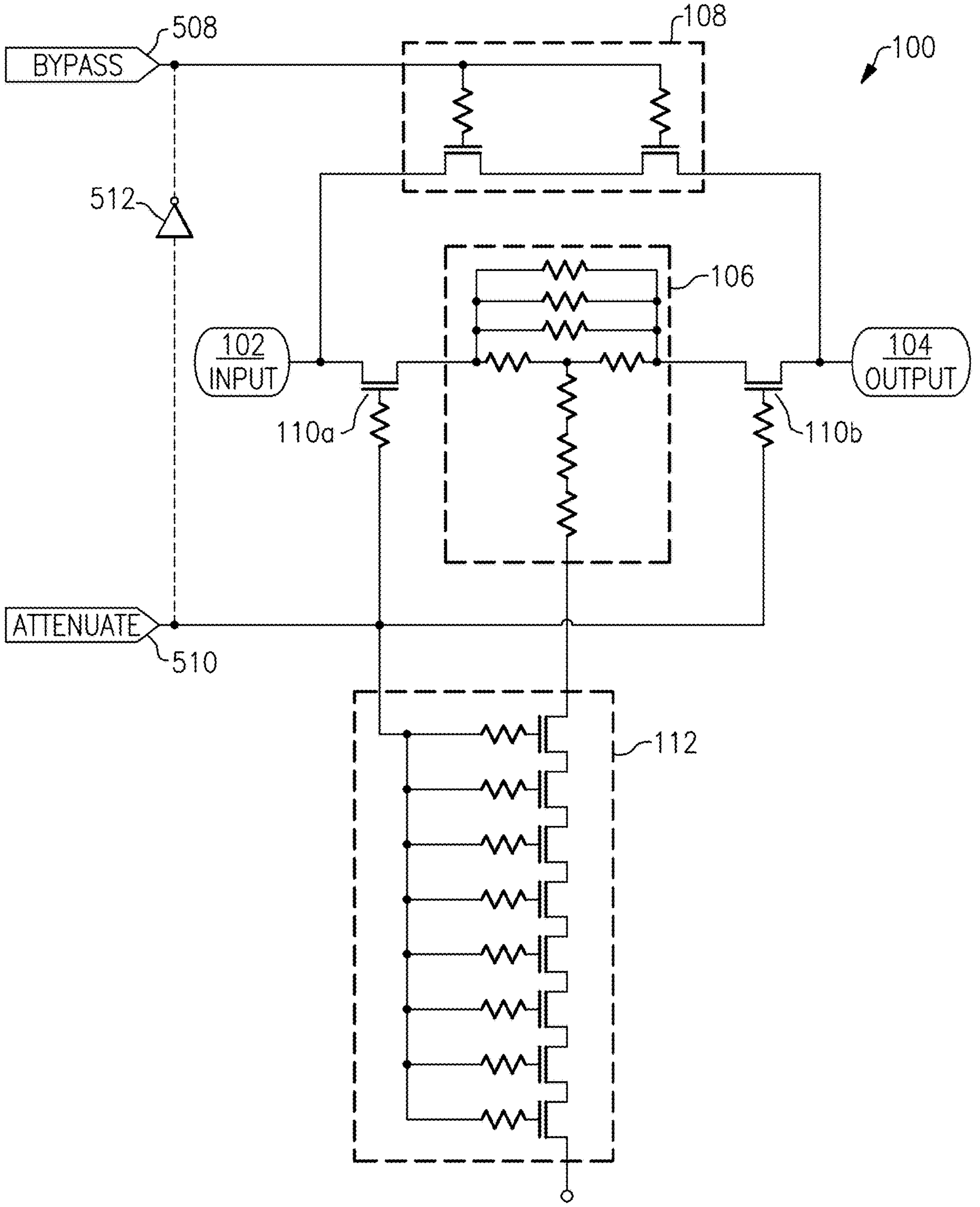
FIG. 5 is a schematic circuit diagram of the example attenuation cell of FIG. 1 including example RF switches of FIG. 2 and the example attenuation network of FIG. 4.

FIG. 5 illustrates an embodiment of an attenuation cell 100 including an attenuation cell input 102, an attenuation cell output 104, an attenuation network 106, e.g. the resistive networks shown in FIG. 3A to FIG. 4B, a bypass switch 108, attenuation switches 110, a shunt switch 112, a bypass control line 508, and an attenuation control line 510. In the example embodiment of FIG. 5, the bypass switch 108, the attenuation switches 110, and the shunt switch 112 each include one or more FETs. The bypass switch 108 includes two series-connected FETs with channel gates coupled to the bypass control line 508 through an impedance. The channel gates of the bypass switch 108 FETs receive a signal from the bypass control line 508 that places the bypass switch 108 FETs in a conducting state or a non-conducting state. When the bypass switch 108 is in a conducting state, e.g., enabled by the bypass control line 508, the signal path through the attenuation cell 100 is from the attenuation cell input 102 through the bypass switch 108 to the attenuation cell output 104, effectively bypassing the attenuation network 106. In this manner, the attenuation cell 100 is in a bypass mode and allows a signal to pass from the attenuation cell input 102 to the attenuation cell output 104 with little to no attenuation. In embodiments, the bypass switch 108 may include more or fewer switching elements, e.g., more or fewer FETs, BJT's, MEMS switches, diodes, etc. The attenuation network 106 may also comprise a variable switch $S_{var}$.

The attenuation switches 110*a*, 110*b* are series-connected with two terminals of the network 106, between the attenuation cell input 102 and the attenuation cell output 104, respectively, and are part of an attenuation path from the attenuation cell input 102 to the attenuation cell resistive output 104. In the example embodiment of FIG. 5, the attenuation switches 110*a* and 110*b* are each a single FET. The shunt switch 112 is a shunt connection between the third terminal of the attenuation network 106 and a reference node, such as ground. In the example embodiment of FIG. 5, the shunt switch 112 includes eight (8) FETs connected in series. In this embodiment, the number of FETs in the shunt switch 112 may vary and may be selected to accommodate particular signal voltages along the signal path from the attenuation cell input 102 to the attenuation cell output 104. One design criteria may include a number of FETs to ensure that when the shunt switch 112 is controlled to be in an off (non-conducting) state, enough of the FETs will remain in a non-conducting state to maintain the shunt switch 112 overall in a non-conducting state even as voltages in the FET channels may vary due to a signal traversing from the attenuation cell input 102 to the attenuation cell output 104. Additionally, the number of FETs in the shunt switch 112 may be chosen to provide for varying applications or other operational requirements.

In some embodiments, each FET of the attenuation switches 110 and the shunt switch 112 has a channel gate coupled to an attenuation control line 510 through impedances. The channel gates of the attenuation switches 110 and the shunt switch 112 FETs receive a signal from the attenuation control line 510 that places the attenuation switches 110 and the shunt switch 112 in a conducting state or a non-conducting state. When the attenuation switches 110 and the shunt switch 112 are in a conducting state, e.g., enabled by the attenuation control line 510, and when the bypass switch 108 is in a non-conducting state, e.g., not enabled by the bypass control line 508, the attenuation cell 100 is in an attenuation mode wherein the signal path through the attenuation cell 100 is from the attenuation cell input 102, through the attenuation switch 110*a*, through a portion of the attenuation network 106, through the attenuation switch 110*b*, and to the attenuation cell output 104. A portion of the signal energy is also shunted to the reference node through a portion of the attenuation network 106, e.g., through shunt impedance R 1 and the shunt switch 112. In this manner, the attenuation cell 100 is in an attenuation mode wherein a signal received at the attenuation cell input 102 is attenuated by the attenuation network 106 and an attenuated portion of the signal is provided at the attenuation cell output 104.

In various embodiments, any of the bypass switch 108, the attenuation switches 110, and the shunt switch 112, may be constructed of other transistor types, such as Bipolar Junction Transistor (BJT's), or other suitable switching structures, such as MEMS switches or diode arrangements, and each may include more or fewer transistors or switching elements and may be controlled by other arrangements.

In at least one embodiment, the bypass switch 108 and the attenuation switches 110 may be matched to have substantially equivalent effect on a signal whether the attenuation cell 100 is in bypass mode or attenuation mode, yielding a more consistent and predictable variation between the two modes. In at least one embodiment, the bypass switch 108 may be configured to have a parasitic effect substantially equivalent to the total parasitic effects of the attenuation switches 110. The beneficial result is the difference in attenuation between bypass mode and attenuation mode is substantially solely the result of the attenuation network 106 because there are minimal, if any, other differences between the bypass path and the attenuation path.

For example, in at least one embodiment, the number and type of switching components, e.g., FETs, included in the bypass path and the attenuation path are equal. For example, as in the attenuation cell of FIG. 5, there are two FETs in the bypass path (e.g., the signal path when the bypass switch 108 is conducting) and two FETs in the attenuation path (e.g., the signal path when the attenuation switches 110 are conducting). Further, the switching components, e.g., FETs, in the bypass switch 108, the attenuation switches 110, and the shunt switch 112, may all be of the same type, variety, and design. Utilizing a matching number and type of switching components results in the switching components having substantially equivalent effect on a signal whether the attenuation cell 100 is in bypass mode or attenuation mode, yielding a more consistent and predictable variation between the two modes, i.e., the difference in attenuation between the two modes is substantially solely due to the attenuation network 106 as there are minimal, if any, other differences between the bypass path and the attenuation path.

In some embodiments, the attenuation cell 100 may include a control inverter 512 that couples the bypass control line 508 to the attenuation control line 510 in a manner that holds the bypass control line 508 signal to be the opposite of the attenuation control line 510 signal. For example, with the control inverter 512 optionally included as shown in FIG. 5, a control signal only need be received at the attenuation control line 510 and the control applied to the bypass switch 108 will automatically be the opposite of the control applied to the attenuation switches 110. In other words, as optionally arranged in FIG. 5, the bypass switch 108 will always be off when the attenuation switches 110 and the shunt switch 112 are controlled to be on, and the bypass switch 108 will always be on when the attenuation switches 110 and the shunt switch 112 are controlled to be off. In other embodiments, a control inverter 512 may be included in the reverse orientation, such that the attenuation cell 100 is controlled by a bypass control line 508 signal, wherein the attenuation switches 110 and the shunt switch 112 will automatically receive a control signal that is the opposite of the bypass control line 508 signal. Providing a control inverter 512 in either manner provides a benefit of only needing one control input from the exterior of the attenuation cell 100. In other embodiments, as previously described, a control inverter 512 may not be included so that the bypass control line 508 and the attenuation control line 510 may be operated independently.

The above description of the operation and arrangement of the bypass switch 108, the attenuation switches 110, and the shunt switch 112, identifies two modes of the attenuation cell 100, a bypass mode and an attenuation mode. Additionally, the attenuation cell 100 may be controlled to be in an isolated mode by controlling at least the bypass switch 108 and at least one of the attenuation switches 110*a*, 110*b* to be non-conducting (i.e., open, or off) at the same time. In the isolated mode effectively none of any signal received at the attenuation cell input 102 is provided at the attenuation cell output 104. While a minimum of the bypass switch 108 and one of the attenuation switches 110 must be off for the attenuation cell 100 to be in an isolated mode, it may be desirable and typical for all switching elements to be off (non-conducting) to produce the maximum isolation between the attenuation cell input 102 and the attenuation cell output 104 when in isolated mode.

The case of the bypass switch 108, the attenuation switches 110, and the shunt switch 112 all being in a conducting state (i.e., closed, or on) is not a typical mode in which to operate the attenuation cell 100, but such a condition would generally be substantially equivalent to the bypass mode because a majority of any signal energy received at the attenuation cell input 102 will tend to follow a signal path through the conducting bypass switch 108 to the attenuation cell output 104. The fact of the attenuation switches 110 being in a conducting state at the same time will generally cause additional parasitic losses resulting in a less effective bypass mode than otherwise would be the case.

While the example embodiment of FIG. 5 illustrates common control of all transistors of the attenuation switches 110 and the shunt switch 112, and common control of all the transistors of the bypass switch 108, in various embodiments control of the bypass switch 108, the attenuation switches 110, the shunt switch 112, or of individual transistors or switching elements thereof, may be arranged differently. In one such embodiment, one or more of the transistors (or switching elements) of the shunt switch 112 may be controlled separately from the series attenuation switches 110*a*, 110*b*. Accordingly, some embodiments support a hybrid attenuation mode wherein the attenuation cell input 102 may be coupled to the attenuation cell output 104, through the attenuation network 106, via the attenuation switches 110*a* and 110*b*, each in a conducting state, while the shunt switch 112 remains in a non-conducting state. In such a scenario, the attenuation cell 100 may provide a different attenuation level than when the shunt switch 112 is in a conducting state.

The three basic modes of operation, isolated, bypass, and attenuation, are summarized in Table 4 below.

TABLE 4

| Mode | Bypass Switch 108 | Attenuation Switches 110a, 110b | Shunt Switch 112 |
|---|---|---|---|
| Bypass Mode | On | Off | Off |
| Isolated Mode | Off | Off | Off |
| Attenuation Mode | Off | On | On |

The three basic modes of operation, isolated, bypass, and attenuation are complemented by an insertion loss mode for fine trimming. An exemplary combination of the three basic modes of operation with the insertion loss mode of operation is summarized in Table 5 below. In a preferred embodiment bypass switch 108 would be the variable switch.

TABLE 5

| Mode | Insertion Loss Switch $S_{var}$ | Bypass Switch 108 | Attenuation Switches 110a, 110b | Shunt Switch 112 |
|---|---|---|---|---|
| Bypass Mode | Off | On | Off | Off |
| Isolated Mode | Off | Off | Off | Off |
| Attenuation Mode | Off | Off | On | On |
| Insertion Loss Mode | On | Off | On | On |

As illustrated in Tables 4 and 5, whenever the bypass switch 108 is in a conducting state (on), the attenuation cell 100 is effectively in a bypass mode. The bypass switch 108 in a conducting state forms a substantially direct coupling from the attenuation cell input 102 to the attenuation cell output 104 with substantially no attenuation. Parasitic losses due to the attenuation network 106 and the attenuation switches 110 are minimized by having the attenuation switches 110 and the shunt switch 112 in a non-conducting (off) state. In various embodiments, the arrangement may be different, and the bypass mode may be more or less effective based upon the state of the attenuation switches 110 and the shunt switch 112.

As further illustrated in Tables 4 and 5, when all the switches are off (non-conducting), the attenuation cell 100 is in an isolated mode where substantially none of a signal received at the attenuation cell input 102 is provided at the attenuation cell output 104.

As finally illustrated in Tables 4 and 5, when the bypass switch 108 is off (non-conducting) and the attenuation switches 110 and the shunt switch 112 are on (conducting), an attenuated portion of a signal received at the attenuation cell input 102 is provided at the attenuation cell output 104. The signal strength at the attenuation cell output 104 is reduced from that at the attenuation cell input 102 by the designed attenuation level of the attenuation network 106 as previously described.

In various embodiments, the attenuation network 106 used in the attenuation cell 100 may be of varying designs to accommodate changing operational parameters or applications, including attenuation levels and impedance matching. For example, the impedances may be of varying values, as previously discussed, and the attenuation network 106 may be of differing circuit design, such as a T, Pi, Delta, bridged, or alternate arrangement. In various embodiments, the attenuation network 106 used in the attenuation cell 100 may be a variable, adjustable, or tunable attenuator, or a multi-step attenuator capable of being further controlled to provide various levels of attenuation.

A multi-cell digital switched attenuator, such as shown in FIG. 6, may include numerous attenuation cells 100 connected in series, and a controller 612 that will control the bypass switch 108, the attenuation switches 110, and the shunt switch 112 of one or more of the attenuation cells 100, to switchably select one or more attenuation cells 100 to be in an attenuation mode, a bypass mode, or an isolated mode. The individual attenuation cells 600 may be designed to provide identical attenuation levels or may be designed to provide different attenuation levels. Higher attenuations are achieved by selecting additional attenuation cells 100 in attenuation mode (in series) to attenuate the signal. Accordingly, a set of attenuation cells 100 may be selected with attenuation levels such that any desired attenuation level is achievable by selectively switching the various series-connected attenuation cells 100 between bypass mode and attenuation mode. In certain embodiments, the attenuation cells 600 may all be of identical design, differing only in the resistive values of their individual resistive networks 606, to provide differing attenuation levels. Additionally, even for differing attenuation levels, all of the attenuation cells 600 may have identical resistor components, varying only in number of the resistor components connected in series and/or parallel, as discussed above. Accordingly, various signal characteristics of each attenuation cell 600 may be substantially similar, varying substantially only by a level of attenuation provided.

FIG. 6 is a block diagram of a digital switched attenuator 600 including an input 602, an output 604, and a plurality of attenuation cells 100 DC coupled in series between the input 602 and the output 604. It is appreciated that each attenuation cell 100 has an attenuation cell input 102 and an attenuation cell output 104 that may be serially connected to adjacent attenuation cells 100. The attenuation cell outputs may be coupled to the adjacent attenuation cell inputs without a capacitive coupling element. The attenuation cells 100*a*, 100*n* at the terminal ends of the digital switched attenuator 600 provide the input 602 and the output 604, respectively, of the overall digital switched attenuator 600. The digital switched attenuator 600 may include any number of attenuation cells 100, depending upon operational parameters and varying application needs, and each individual attenuation cell 100 may be of any individual attenuation level. By controlling the operational state of each of the attenuation cells 100, i.e., to be in attenuation mode, bypass mode, or isolated mode, any of various total attenuation levels may be achieved. Various embodiments may have any number of, and any attenuation levels of, attenuation cells 100 arranged in any relative position to one another.

The digital switched attenuator 600 of FIG. 6 also includes a controller 612 that controls the bypass control lines 508 carrying control signals to the attenuation cells 100 and the attenuation control lines 510 carrying control signals to the attenuation cells 100. The controller 612 controls the bypass and attenuation signals to the attenuation cells 100, thereby controlling the operational states of the attenuation cells 100 and therefore the total attenuation applied to a signal received at the input 602. The controller 612 may receive instructions via a communication interface from another component, to determine the desired operation state of the digital switched attenuator 600, or the controller 612 may have various sensors, such as an output power sensor, and the controller 612 may be programmed or instructed to maintain a certain output power level, for example. Other components that may communicate with the controller 612 may include, for example, a baseband transceiver controller, an amplifier controller, a coupler controller, a frequency band controller, a controller for a radio frequency front-end module, and the like.

Still referring to FIG. 6, the digital switched attenuator 600 is capable of passing a signal substantially unattenuated (0 dB attenuation) when the controller 612 enables a bypass mode in all of the attenuation cells 100 by controlling the bypass switch 108 of each attenuation cell 100 to be in an on (conducting) state. In this state, a signal received at the input 602 will propagate through the bypass switches 108 of all the attenuation cells 100 and be provided at the output 604 substantially unattenuated.

By controlling signals on the bypass control lines 508 and the attenuation control lines 510, and thereby controlling the conducting or non-conducting states of the bypass switches 108 and the attenuation switches 110, respectively, of each attenuation cell 100, the digital switched attenuator 600 of FIG. 6 may be placed in condition to provide any attenuation level desired from 0 dB (i.e., all attenuation cells 100 in bypass mode) to its maximum attenuation level (i.e., all attenuation cells 100 in attenuation mode), in increments based upon the possible combinations of bypass modes and attenuation modes among all of the attenuation cells 100. Various embodiments may have more or fewer attenuation cells 100, or a different arrangement of attenuation cells 100, or differing incremental attenuation levels, or may have attenuation levels of the attenuation cells 100 chosen, designed, or arranged such that all possible intermediate incremental values are achievable, or may be arranged so only a particular set of attenuation values is achievable without all possible intermediate incremental values being achievable. The controller 612 may be configured to accept a range of binary input values and map them to a particular total attenuation level by controlling signals on the bypass control lines 508 and the attenuation control lines 510. In certain embodiments, the controller 612 may be programmable or otherwise configurable. Other suitable controllers may be provided in certain embodiments.

The digital switched attenuator 600 of FIG. 6 may substantially reject, or block, a signal received at the input 602 to provide substantially no signal at the output 604 (i.e., substantially infinite attenuation), by placing one or more of the attenuation cells 100 into isolated mode. One approach includes placing all the attenuation cells 100 into isolated mode. A better approach may be to place a number of the attenuation cells 100 into attenuation mode, particularly those near the input 602, and perhaps those near the output 604, while placing the more central attenuation cells 100 in isolated mode. The benefit of leaving periphery attenuation cells 100 in attenuation mode is that any signal received at the input 602 (or at the output 604) is attenuated by the attenuation cells 100 encountered by the signal before reaching an isolated attenuation cell, thus maintaining an impedance match at the input 602 and the output 604 and reducing any reflected portion of the received signal. Reflected signal energy will occur at the first isolated attenuation cell 100 the signal encounters, due to the discontinuity of an open circuit in the isolated attenuation cell 100.

For example, if the digital switched attenuator 600 of FIG. 6 is controlled by the controller 612 to be in a state where the first two attenuation cells 100*a*, 100*b* are in attenuation mode, and the third attenuation cell 100*c* is in isolated mode, a signal that arrives at the input 602 is attenuated by the first two attenuation cells 100*a*, 100*b*, which may be, for example, an attenuation of 12 dB (e.g., having traveled through two 6 dB attenuation cells) before reaching the isolated third attenuation cell 100*c*. Any reflected signal, which is signal power being sent back toward the input 602, is further attenuated by another 12 dB as the reflected signal passes back through the first two attenuation cells 100*a*, 100*b*, resulting in the reflected signal being at least 24 dB lower than it might otherwise have been. In some embodiments, additional control lines may be included to control the input attenuation switch 110*a* and the shunt switch 112 separately from the output attenuation switch 110*b*, of one or more attenuation cells 100, to provide a signal path through a portion of the attenuation network 106 of the attenuation cell 100 in isolated mode, further reducing the power of any portion of a reflected signal. In this manner, the digital switched attenuator 600 may be operated to substantially neither pass nor reflect signals received at either of the input 602 or the output 604, or both.

In at least one embodiment, attenuation cells 100 having higher attenuation levels may be provided at the periphery of the digital switched attenuator 600, e.g., the outermost attenuation cells may have higher attenuation levels than the innermost attenuation cells, along the series-connected plurality of attenuation cells. This will result in higher attenuation levels applied to a signal received from either the input 602 or the output 604 when the digital switched attenuator 600 is in an isolated state where periphery attenuation cells are in an attenuation mode and at least one central attenuation cell is in an isolated mode. As discussed above, this reduces the energy of any reflected signal or substantially absorbs all signal energy received.

Conventional multi-cell attenuators require DC-blocking capacitive components to ensure that adjacent switches may have opposing polarity as required by some usage states, and thus DC-blocking capacitors in these conventional designs provide DC isolation. The presence of DC-blocking elements between one or more attenuation cells allows for transistor channels in adjacent attenuation cells to be biased relative to each other, i.e., have a DC voltage offset from the transistor channels of the adjacent attenuation cell. Aspects and embodiments of switched attenuators disclosed herein, however, alleviate or reduce the need for DC-blocking capacitors in part because impedance of the DC-blocking capacitors increases for lower frequency signals, requiring the capacitors to be made very large or else they will block the low frequency signal. Fabricating large capacitors is disadvantageous for the typical high cost of circuit space and desired small size and high efficiency of integrated circuits. Accordingly, aspects and embodiments disclosed herein allow multi-cell attenuator designs without capacitive coupling between the attenuation cells and therefore have no channel bias, do not require a negative voltage generator (NVG), have no standby current, and have increased suitability for lower frequency signals, such as into the single digit megahertz frequencies, e.g., 5 MHz. Accordingly, aspects and embodiments of switched attenuators as disclosed herein are particularly suitable for lower frequency applications, such as those supported by the Data over Cable Service Interface Specification (DOCSIS) 3.1 with an upstream carrier frequency band of 5 MHz to 204 MHz. Accordingly, aspects and embodiments of switched attenuators as disclosed herein are suitable for such applications and may be beneficially incorporated with amplifiers or within devices, such as described below with reference to FIG. 9A, FIG. 9B, and FIG. 10, to provide tunable signal levels within cable modem applications. For example, switched attenuators as disclosed herein may be advantageously implemented to provide monotonic signal adjustments of 1 dB step sizes or less with accuracy in the +/−0.5 dB or better across the DOCSIS 3.1 upstream frequency band.

Thus, aspects and examples provide various circuit designs to extend the bandwidth of a switched attenuator by, for example, directly DC coupling the attenuation cells in series with one another and without a capacitive component interposed between adjacent attenuation cells. For example, the output of a first attenuation cell may be directly coupled, without a capacitor, to the input of the next attenuation cell. Accordingly, a series of such attenuation cells may be DC coupled such that a DC component at the input may be conveyed from one attenuation cell to the next, and may be conveyed to the output. In some examples, a DC component may be blocked near the output to protect other equipment, or may be blocked after (or outside of) the switched attenuator, or may not be blocked at all.

In addition, example switched attenuators have been provided that incorporate resistor networks within the attenuation cells that are less susceptible to manufacturing variations.

It is to be appreciated that the attenuation cell 100 as shown in either of FIG. 1 and FIG. and the digital switched attenuator 600 as shown in FIG. 6 may be symmetrical with respect to input and output. The signal path through each attenuation cell 100, and thereby through the digital switched attenuator 600, is symmetrical with respect to inputs 102, 602 and outputs 104, 604. This results in attenuation cells 100 and a digital switched attenuator 600 capable of acting equally upon a signal whether the signal is received at the input or the output. Accordingly, the labels of input and output may be considered arbitrary and interchangeable in various embodiments, and the attenuation cell 100 or the digital switched attenuator 600 may be used in either forward or reverse directions.

Figure 7:
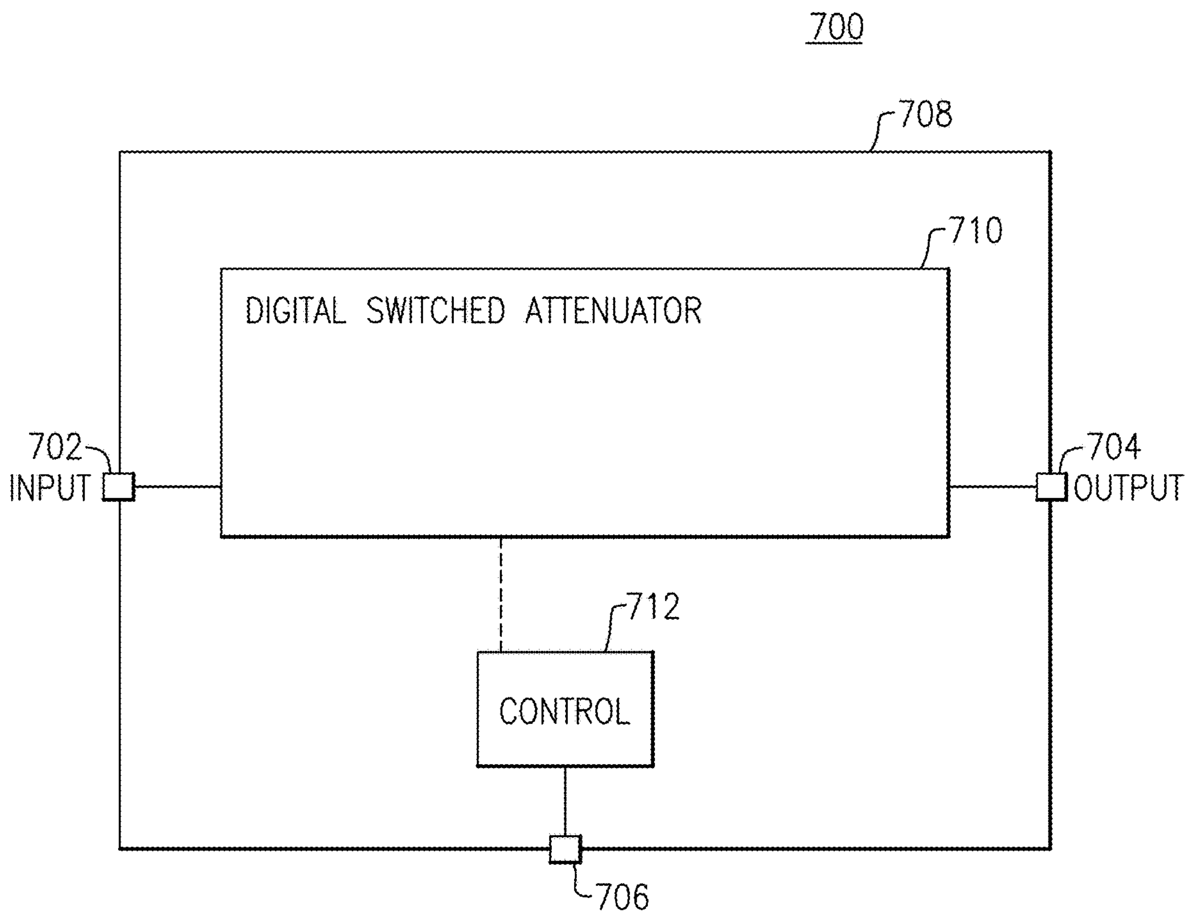
FIG. 7 is a block diagram of an example packaged module including a digital switched attenuator.

According to other aspects, any of the attenuators disclosed herein may be incorporated into various packages, modules, or devices to create a commercial production unit. FIG. 7 to FIG. 9 illustrate examples of modules that can include any of the configurable attenuators discussed herein. These example modules can include any combination of features associated with the attenuators disclosed herein, including isolation, step values, and compensation for manufacturing variations.

FIG. 7 is a block diagram of one example of a packaged module 700 that includes an embodiment of the attenuators disclosed herein as digital switched attenuator 710. The packaged module 700 includes a substrate 708, such as, for example, a package substrate for packaging of the circuitry of the digital switched attenuator 710 and other circuitry die. The packaged module 700 may also include a control element 712, such as a controller. Either of the digital switched attenuator 710 or the controller 712 may be implemented on a die or in the substrate 708. In some embodiments, the module 700 can include one or more packaging structures to, for example, provide protection and facilitate easier handling of the module 700. Such a packaging structure can include an overmold formed over a packaging substrate and dimensioned to substantially encapsulate the various dies and components thereon. The packaged module 700 further includes connectivity from the digital switched attenuator 710 and the controller 712 to the exterior of the substrate 708 to provide signal and control interconnections, such as input 702, output 704, and control interface 706. The connections 702, 704, and 706 may include contacts, wirebonds, solder bumps, balls, lands, pins, sockets, etc. The control interface 706 provides an interface to communicate to or control the configurable nature of the digital switched attenuator 710, for example, isolation settings, attenuation step values, and compensation, as discussed herein. Any of the aspects and embodiments of the attenuators discussed herein may allow for bi-directional operation, such that, for example, the input 702 and the output 704 might be interchangeable in any given module 700.

Figure 8A:
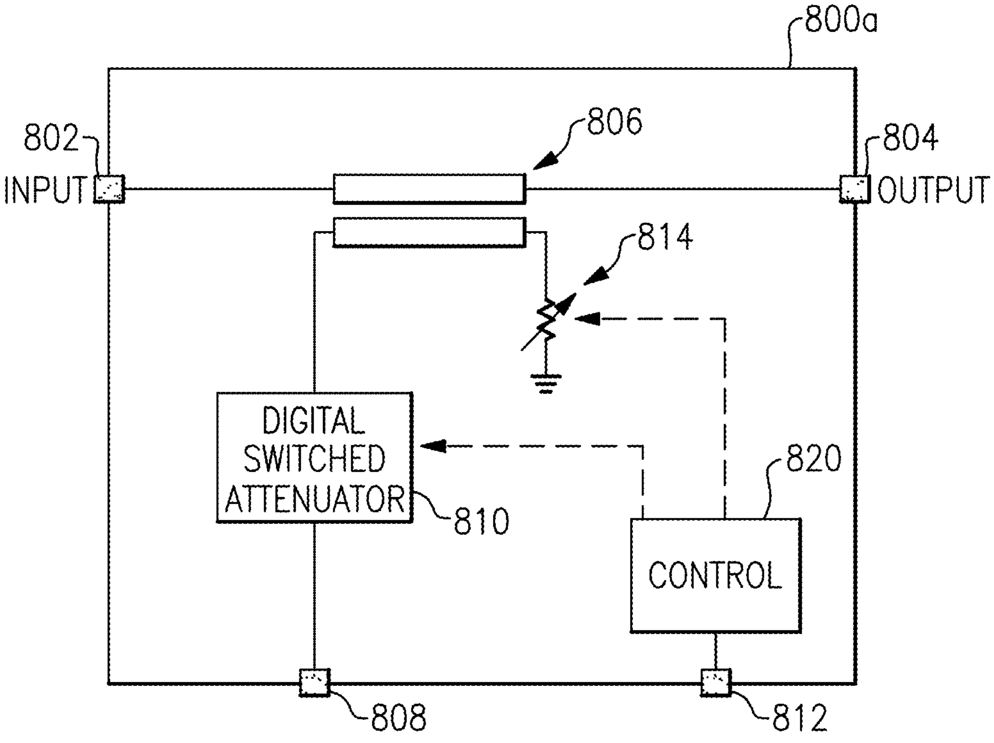
FIG. 8A to FIG. 8F are block diagrams of example coupler modules including a digital switched attenuator.

FIG. 8A is a block diagram of an example of a coupler module 800*a* that includes an attenuator 810 configured to attenuate a signal from a coupler 806. Similar to module 700 above, the module 800*a* may include packaging and connectivity to external devices. In the example module 800*a* of FIG. 8A, shown are connections for the input 802, output 804, coupled output 808, and a control interface 812 to a control element 820. The coupler 806 may provide a coupled portion of an input signal received at the input 802 and provide it to the attenuator 810, which attenuates the coupled signal in accordance with its current configuration. Module 800*a* allows a configurable coupling factor, at least because the attenuator 810 allows for various attenuation values of the coupled output signal.

Figure 8B:
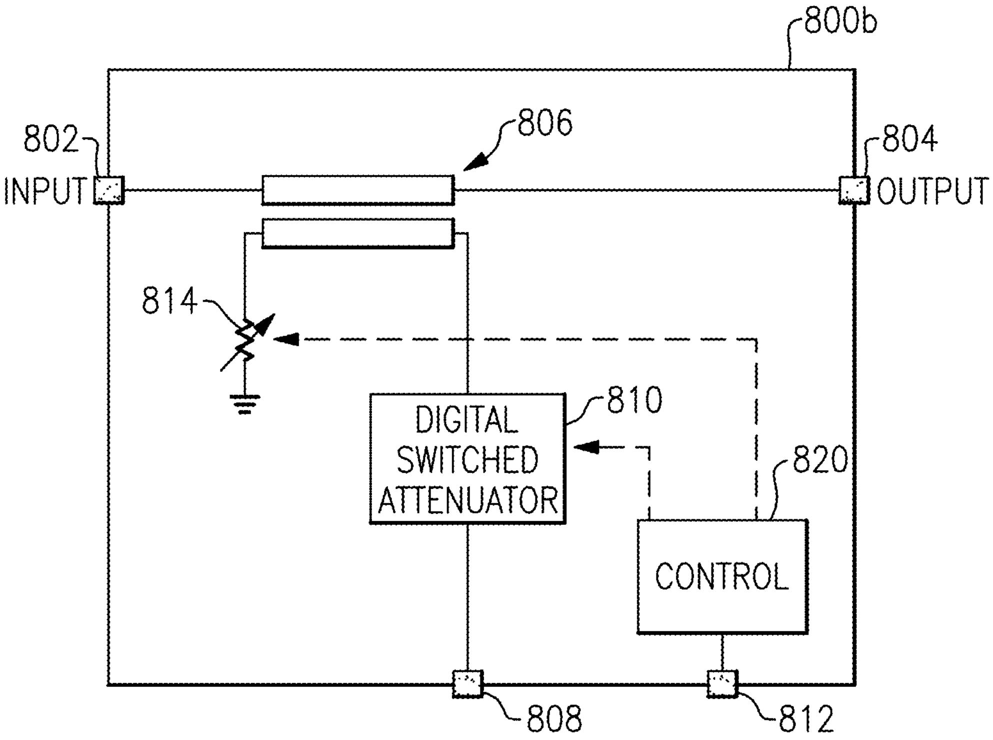

FIG. 8B is a block diagram of another example of a coupler module 800*b* that includes an attenuator 810 configured to attenuate a coupled signal. In this example, the coupler 806 is configured for reverse operation, providing a coupled portion of an input signal received at the input 804 to the attenuator 810, which attenuates the coupled signal in accordance with its current configuration.

Figure 8C:
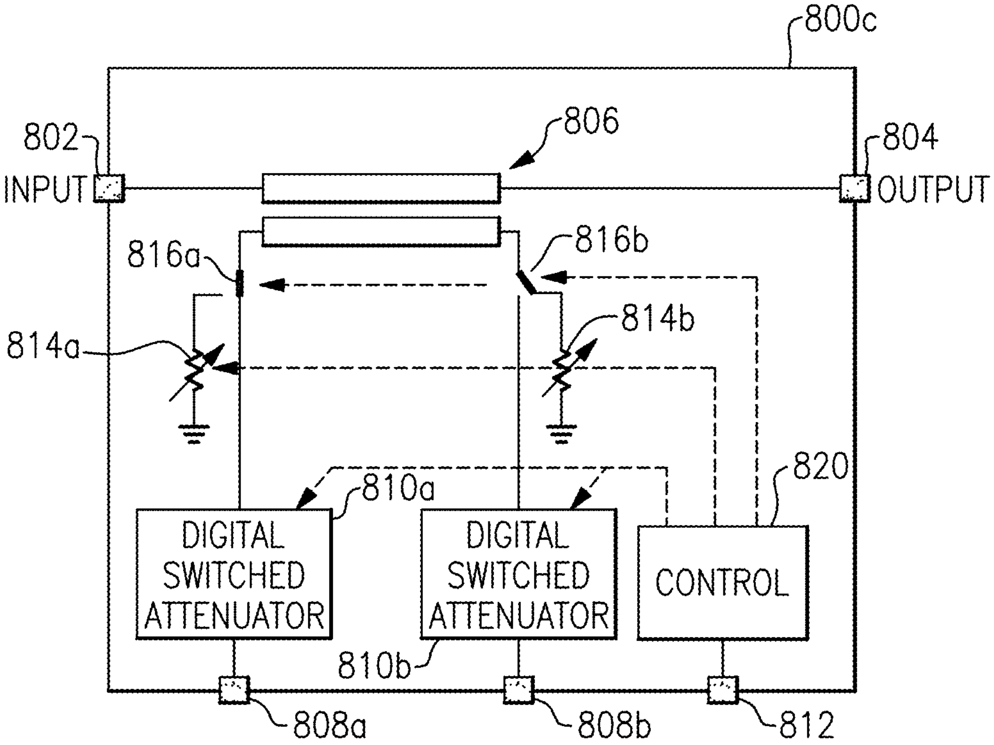

FIG. 8C is a block diagram of another example of a coupler module 800*c*. In this example, the coupler 806 is configured to allow bi-directional switched coupling. When in the configuration shown, the module 800*c* provides a forward coupled signal (coupled from a forward signal received at the input 802) to an attenuator 810*a*, by switching a forward coupled port to the attenuator 810*a* at switch 816*a* and by switching an isolation port to a termination impedance 814*b* at switch 816*b*. A reverse coupled signal (from a reverse signal received at the output 802) may be provided to another attenuator 810*b* by alternating the configuration of the switches 816*a*, 816*b*. As shown, the termination impedances 814*a* and 814*b* may be variable or adjustable impedances. The coupler module 800*c*, for example, has two attenuated coupled outputs 808*a* and 808*b* for forward and reverse coupled signals, respectively.

Figure 8D:
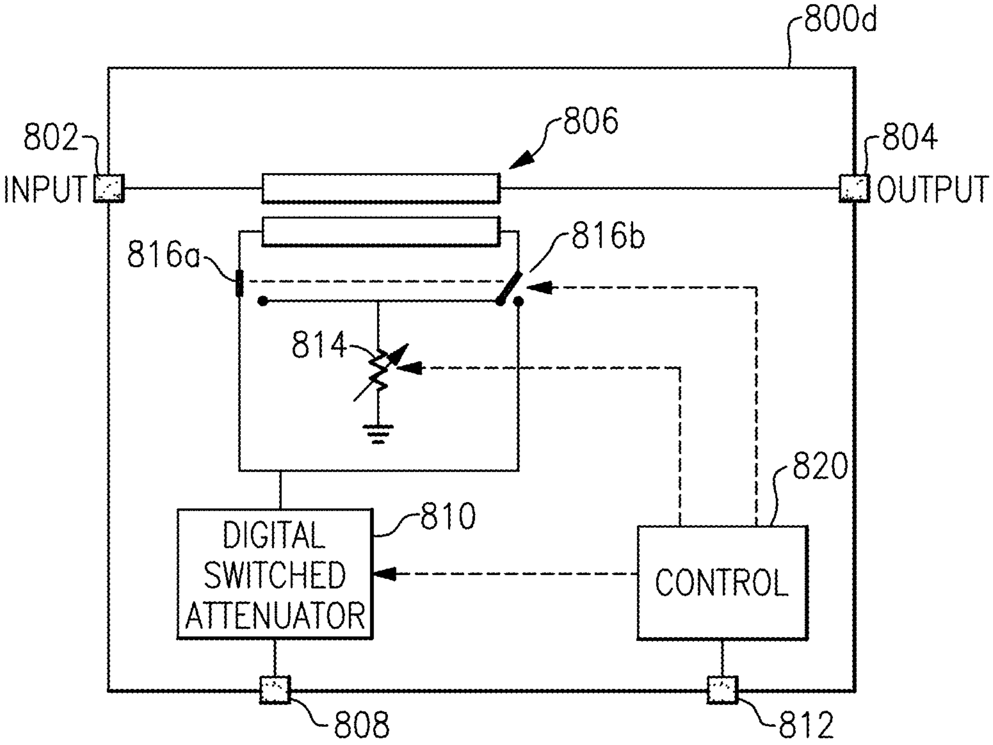

FIG. 8D is a block diagram of another example of a coupler module 800*d*. In this example, the coupler 806 is configured to allow bi-directional switched coupling similar to FIG. 8C with only a single attenuator 810 and a single termination impedance 814. The coupler 806 of FIG. 8D is selectively switchable to couple a forward signal or a reverse signal, and the attenuator 810 attenuates whichever coupled signal is provided by the coupler 806. In particular, the coupler 806 may provide a coupled portion of a signal received at the input 802 or a signal received at the output 804.

Figure 8E:
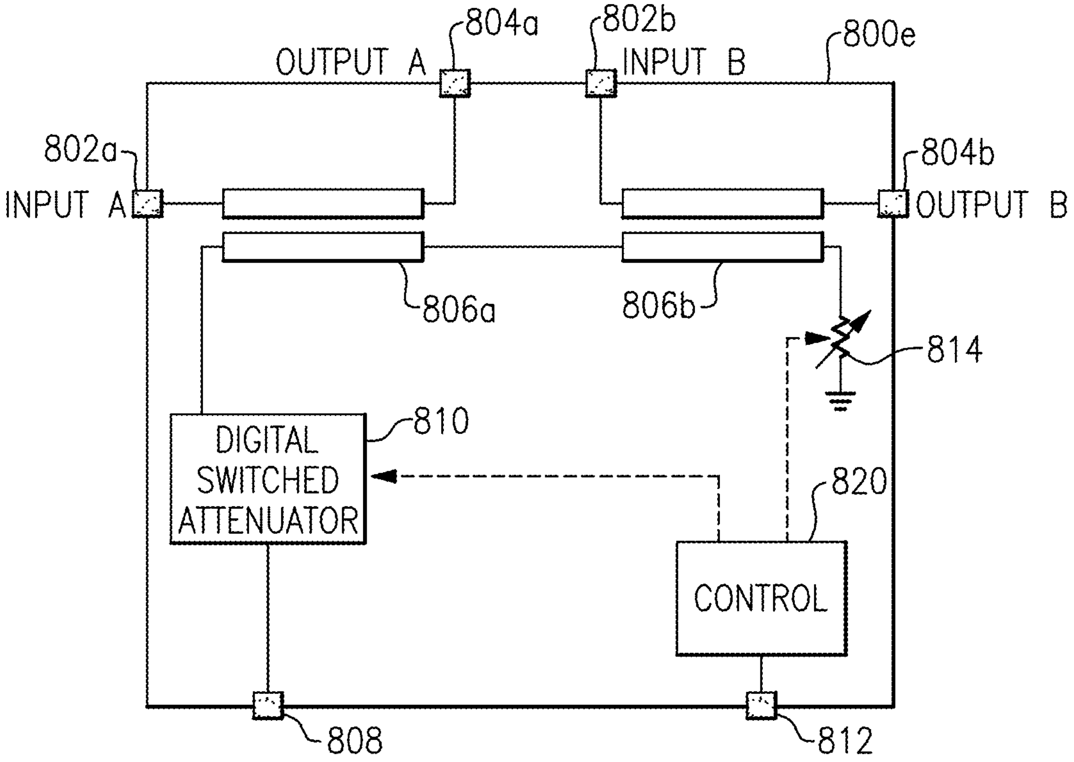

FIG. 8E is a block diagram of another example of a coupler module 800*e*. In this example, the coupler module 800*e* includes two couplers, 806*a* and 806*b*, that may be designed to operate for different frequencies or frequency bands. The coupler module 800*e* is an example of a dual-band attenuated coupler module. Each of the couplers 806*a*, 806*b* has an input 802*a*, 802*b*, respectively, and an output 804*a*, 804*b*, respectively. As shown, the coupling lines of the couplers 806*a*, 806*b* are connected in series and each provides a forward coupled signal to an attenuator 810. A signal provided at coupled output 808 is an attenuated combination of a coupled signal from the first coupler 806*a* in the first frequency band and a coupled signal from the second coupler 806*b* in the second frequency band.

Figure 8F:
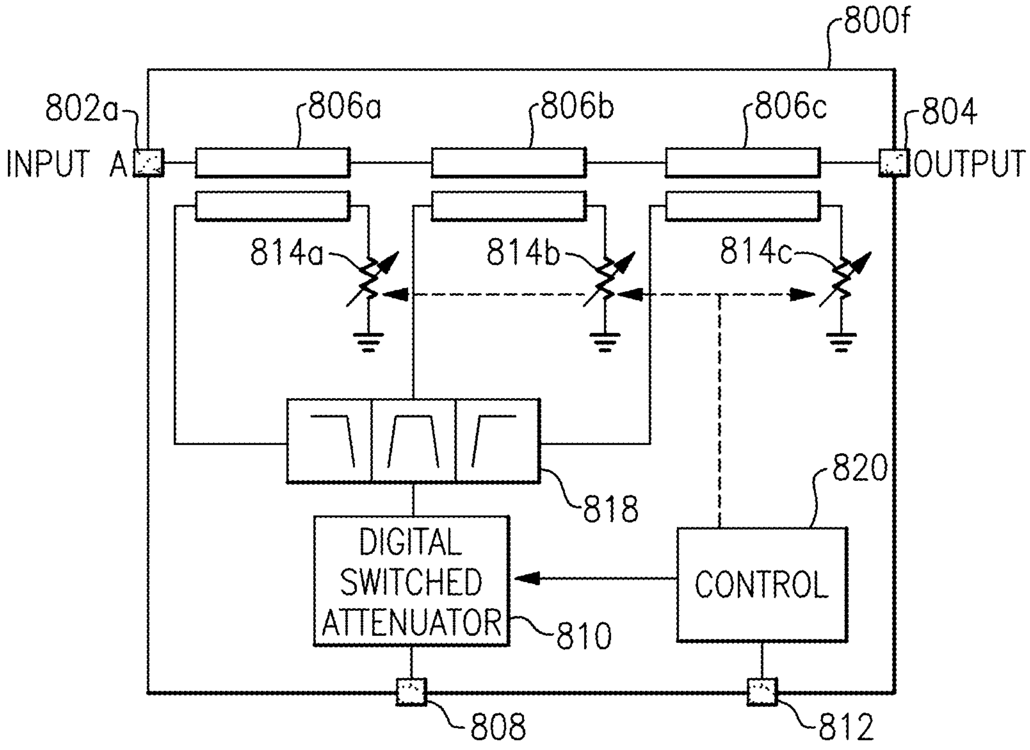

FIG. 8F is a block diagram of another example of a coupler module 800*f*. The coupler module 800*f* may be an example of a tri-band attenuated coupler module. The coupler module 800*f* includes three couplers 806*a*, 806*b*, 806*c*, that may be designed to operate for different frequencies or frequency bands. The coupled output of each coupler 806*a*, 806*b*, 806*c*, is combined by a triplexer 818 that provides combined coupled signals to the attenuator 810.

While FIG. 8A through FIG. 8F illustrate various embodiments of a coupler module with an attenuator 810, other embodiments may be arranged differently. For example, a coupler module may have any number of one or more couplers whose various ports may be provided in various ways, and whose coupled outputs may be combined in various ways (e.g., by series connection, by a combiner, etc.), and whose connectivity to termination impedances, combiners, and/or attenuators may be selectively switched. Accordingly, any number of couplers, attenuators, switches, combiners, and impedances may be arranged in various fashions to accommodate various application needs and/or operational characteristics. Additionally, a control circuit may control the various switches, adjustable impedances, and attenuation settings. Any of the modules may include packaging structures to provide protection and facilitate handling of the modules.

Figure 9A:
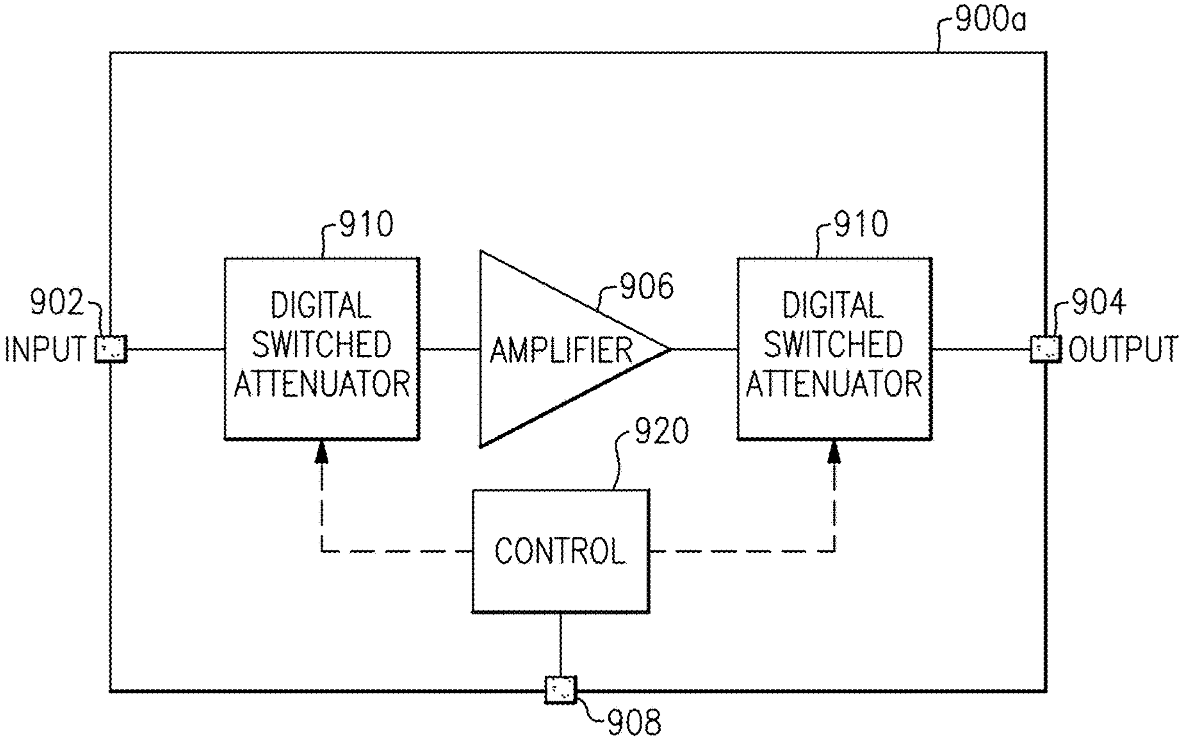
FIG. 9A to FIG. 9C are block diagrams of example amplifier modules including a digital switched attenuator.

FIG. 9A is a block diagram of an example of an amplifier module 900*a* that includes two attenuators 910 configured to attenuate signals associated with a power amplifier 906. Similar to module 700 and the modules 800*a-f* above, the module 900*a* may include packaging and connectivity to the exterior. In the example module 900*a* of FIG. 9A, shown are connections for the input 902 and output 904. A control interface 908 to a control element 920 of the attenuators 910 is also shown. The attenuators 910 may attenuate an input signal before the signal is amplified by the power amplifier 906, or may attenuate an amplified signal provided by the power amplifier 906, or both. The module 900*a* may have an alternate arrangement having only one of the attenuators 910. As shown, two (or more) attenuators 910 could be provided and connected such that attenuation occurs on both the input and the output of the power amplifier 906, which may yield flexibility in balancing or achieving total gain, noise figures, and other operational parameters. Accordingly, the amplifier module 900*a* may act as a variable gain amplifier because the ratio of the output signal to the input signal may be adjusted by the configurable attenuators 910.

Figure 9B:
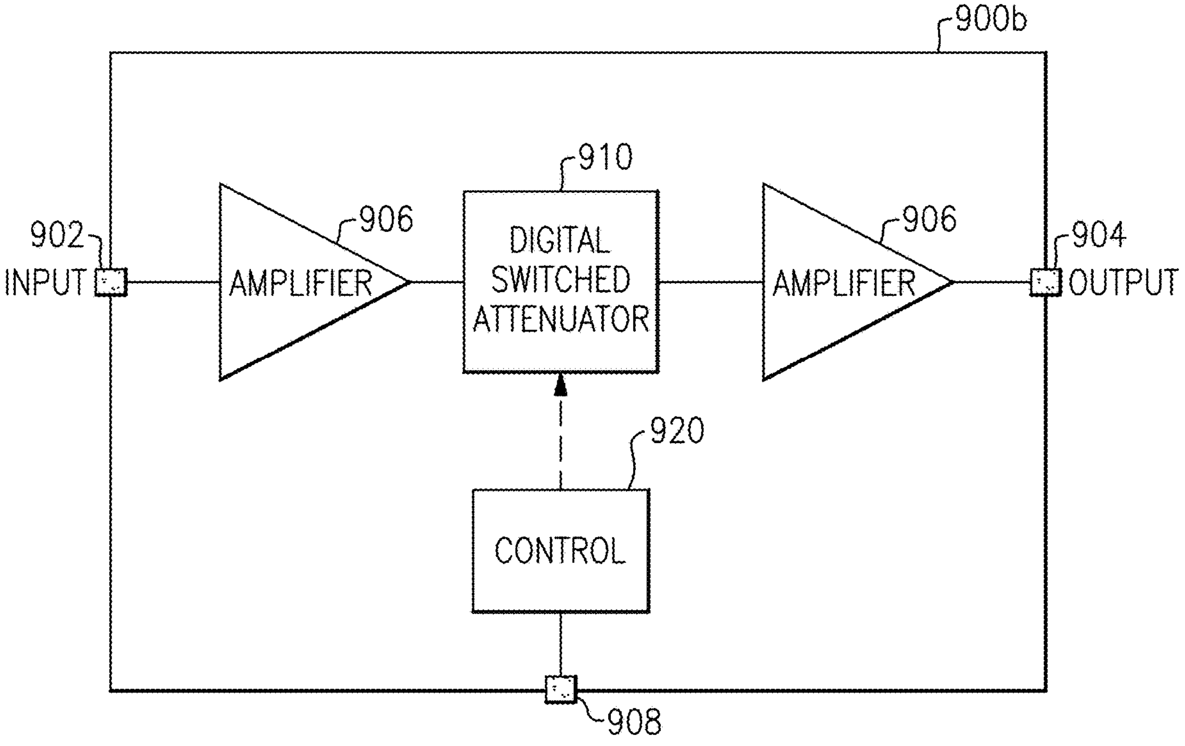

FIG. 9B is a block diagram of another example of an amplifier module 900*b*. The amplifier module 900*b* includes two amplifiers 906 coupled in series on either side of a single attenuator 910. The amplifiers 906 may be adjustable gain amplifiers. The amplifier module 900*b* may include packaging as discussed above. The arrangement of amplifiers 906 and the attenuator 910 is one example of an arrangement that may allow flexibility in balancing or achieving total gain, noise figures, and other operational parameters in a variable gain amplifier. Alternate amplifier modules may include both multiple amplifiers and multiple attenuators for increased flexibility, and may include switching components to flexibly route signals.

Figure 9C:
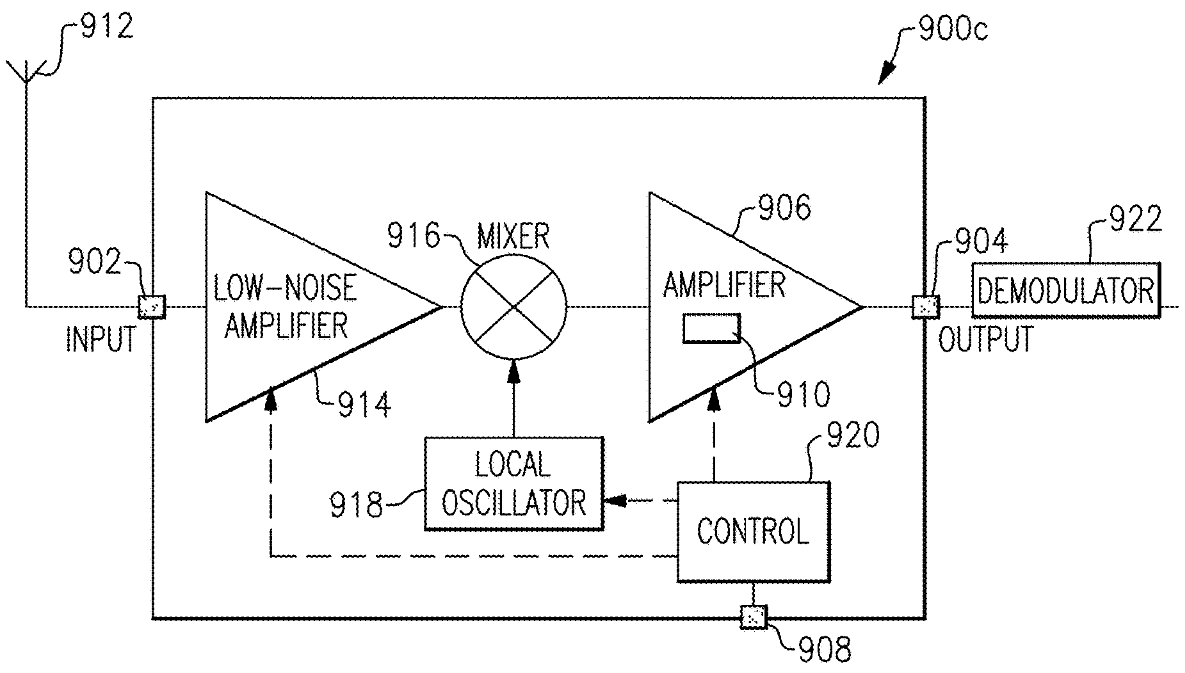

FIG. 9C is a block diagram of an example of an intermediate frequency (IF) amplifier module 900*c* that includes an attenuator 910. The IF amplifier module 900*c* is shown in an example use with an antenna 912 that may receive a radio frequency (RF) signal and provide it to the input 902, from which a low-noise amplifier 914 boosts the signal strength. The amplified RF signal is mixed by a mixer 916 with an IF waveform from a local oscillator 918 and provided to an IF amplifier 906. In the example module 900*c*, the IF amplifier 906 has at least one integrated attenuator 910, similar to the amplifier module of FIG. 9A, to allow variable gain adjustment. The amplified IF signal may be provided to a demodulator 922 coupled to the output 904 of the IF amplifier module 900*c*. Similar to the example modules previously described, the IF amplifier module 900*c* may have a control interface 908. Alternate embodiments may include one or more attenuators 910 coupled to the input or output of amplifier 906 rather than integrated with the amplifier 906.

While FIG. 9A through FIG. 9C illustrate various embodiments of an amplifier module with an attenuator 910, other embodiments may be arranged differently. FIG. 7 to FIG. 9 described above illustrate various example modules that include switched attenuators as disclosed herein. Other modules in accord with those disclosed herein may include other components and features, such as, for example, a sensor, an antenna switch module, a transmitter, receiver, or transceiver, and any combination of the disclosed or other components. An attenuator of the types disclosed herein may be incorporated into any number of packages, modules, or devices to accommodate changing operational parameters or specific applications.

Figure 10:
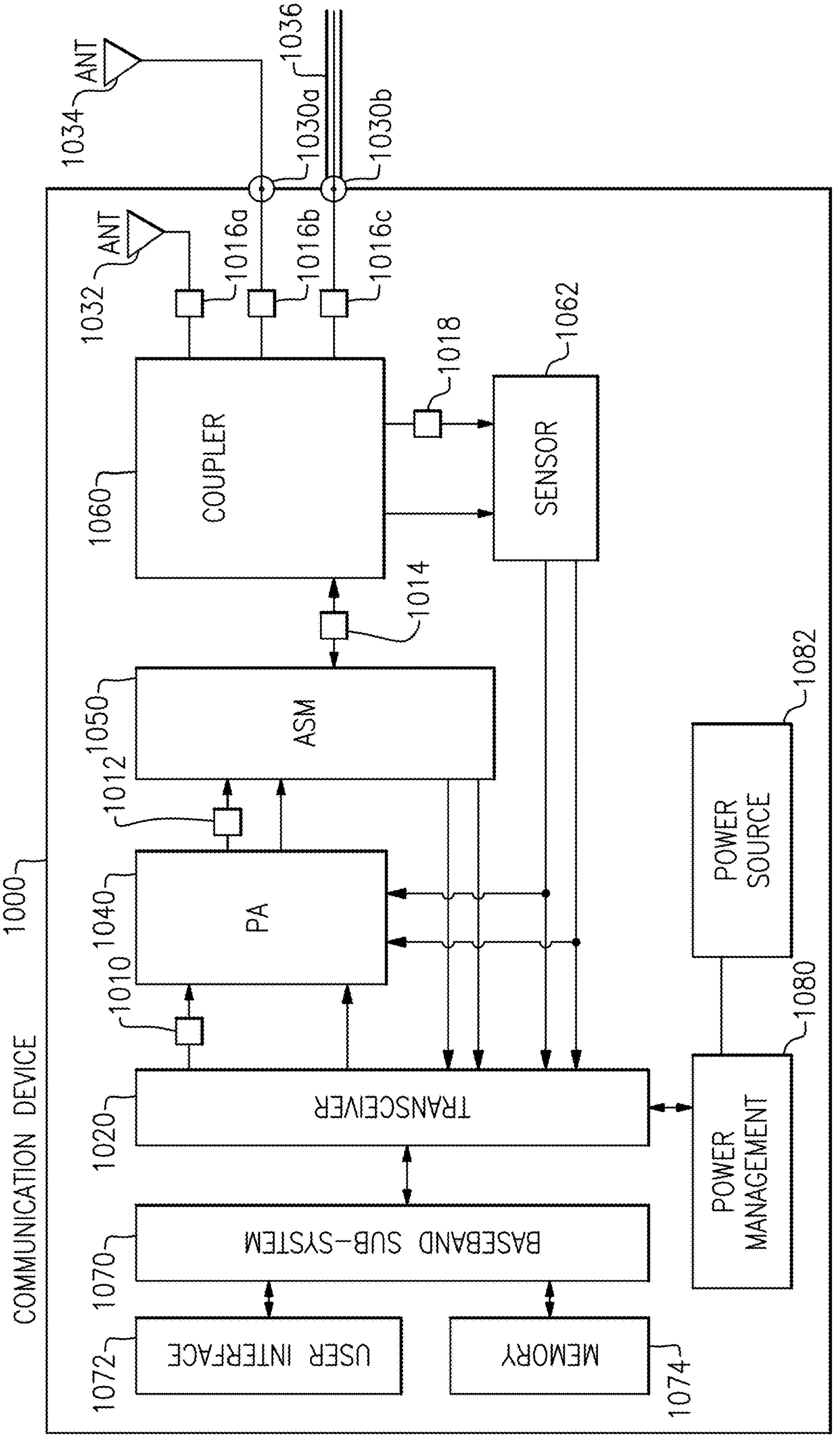
FIG. 10 is a block diagram of an example communication device that may include one or more digital switched attenuators.

In an embodiment, a switched attenuator of the types disclosed herein may be incorporated into an electronic device. An example of such a device is shown in FIG. 10, which is a block diagram of a communication device 1000 that can have one or more switched attenuators in accordance with any of the principles and advantages discussed herein. The example communication device 1000 may be a wireless device, such as, for example, a mobile phone, a smart phone, a tablet, a wireless access point, a router, a modem, an end point, or the like, or may be a wired device, such as, for example, a cable modem, a set top box, or the like, or may be a combination of a wired and wireless device. A communication device may include additional elements not shown in FIG. 10 and/or may include a sub-combination of those elements shown.

The example communication device 1000 may include an external interface 1030*a*, 1030*b*, to which a communication cable 1036 or an antenna 1034, for example, may be connected for transmitting and receiving communication signals, such as radio frequency (RF) signals. The communication device 1000 may also or alternatively have an internal antenna 1032. A coupler 1060 may provide to a sensor 1062 a coupled signal of the RF signal going to or from the interface 1030 and/or the internal antenna 1032, for monitoring and adjusting power levels and/or transmission mismatch characteristics. A switch module 1050 may control or direct received RF signals from the interface 1030 to a transceiver 1020, and control or direct RF signals from a power amplifier 1040 to the interface 1030. The transceiver 1020 may be controlled by a baseband sub-system 1070 having a user interface 1072 and a memory 1074, and the example communication device 1000 may have a power management system 1080 and a power source 1082, such as a battery or power supply.

One or more switched attenuators in accord with those disclosed herein may be incorporated in the communication device 1000 in a number of configurations in accord with desired operational characteristics of the communication device 1000. For example, a switched attenuator 1010 may be included to attenuate an input signal to the power amplifier 1040. A switched attenuator 1012 may attenuate an output signal of the power amplifier 1040. An attenuator 1014 and/or a switched attenuator 1016 may attenuate a transmit or receive signal, or both, between the switch module 1050 and the interface 1030 and/or the internal antenna 1032, with or without a coupler 1060 in between. Additionally, a coupled output from the coupler 1060 may be configured with a switched attenuator 1018. Any of the switched attenuators 1010, 1012, 1014, 1016, and 1018 may be present, or additional switched attenuators may be present, in various additional or alternate arrangements, to attenuate a signal at varying locations to accommodate changing operational parameters or applications.

In some implementations, a device and/or a circuit having one or more features described herein can be included in a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly coupled, or coupled by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, filters, multiplexer, devices, modules, wireless communication devices, apparatus, methods, and systems described herein may be embodied in a variety of other forms. Furthermore, various omissions, substitutions and changes in the form of the resonators, filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A switched attenuator comprising:

a radio frequency (RF) input;

an RF output; and an attenuation cell connected between the RF input and the RF output and including a variable switch with a variable on-resistance, the variable switch including a first field-effect transistor (FET) having a first independently trimmed periphery and a second FET having a second independently trimmed periphery different than the first independently trimmed periphery, each of the first and second FETs being a single FET, the variable switch being configured to enable the first FET and disable the second FET in a first mode of operation and enable the second FET and disable the first FET in a second mode of operation to fine-tune the variable on-resistance of the variable switch.

2. The switched attenuator of claim 1 wherein the variable switch is configured for fine trimming an insertion loss of the variable switch.

3. The switched attenuator of claim 1 wherein the attenuation cell comprises an attenuation network, the attenuation network optionally comprising at least one of a PI-network, a T-network, and a bridged T-network.

4. The switched attenuator of claim 3 wherein the attenuation network comprises two impedances connected in series between input and output terminals of the attenuation network.

5. The switched attenuator of claim 4 wherein the attenuation network further comprises a bridge impedance connected between the input and the output terminals of the attenuation network.

6. The switched attenuator of claim 5 wherein the two series connected impedances and the bridge impedance are connected in parallel between the input and the output terminals of the attenuation network.

7. The switched attenuator of claim 3 wherein the variable switch is connected between input and output terminals of the attenuation network.

8. The switched attenuator of claim 4 wherein the attenuation network comprises a shunt impedance coupled between the two series connected impedances.

9. The switched attenuator of claim 1 wherein the variable switch comprises a stack of a plurality of FETs, the plurality of FETs including at least one of the first FET and the second FET.

10. The switched attenuator of claim 9 wherein the at least one of the first FET and the second FET comprises a trimmed on-resistance forming, at least in part, the variable on-resistance of the variable switch.

11. The switched attenuator of claim 10 wherein one of the plurality of FETs has a fixed on-resistance forming, at least in part, the variable on-resistance of the variable switch.

12. The switched attenuator of claim 9 wherein the variable on-resistance of the variable switch is equal to a sum of a respective on-resistance of each of the plurality of FETs of the stack.

13. A method of controlling a switched attenuator comprising a radio frequency (RF) input, an RF output, and an attenuation cell connected between the RF input and the RF output and including a variable switch with a variable on-resistance, the method comprising fine-tuning the variable on-resistance of the variable switch, the fine-tuning including enabling a first FET of the variable switch having a first independently trimmed periphery and disabling a second FET of the variable switch having a second independently trimmed periphery different than the first independently trimmed periphery in a first mode of operation, and disabling the first FET and enabling the second FET in a second mode of operation, each of the first and second FETs being a single FET.

14. The method of claim 13 wherein the variable switch comprises a stack of a plurality of FETs, the plurality of FETs including at least one of the first FET and the second FET.

15. The method of claim 14 wherein the at least one of the first FET and the second FET comprises a trimmed on-resistance forming, at least in part, the variable on-resistance of the variable switch.

16. The method of claim 15 wherein one of the plurality of FETs has a fixed on-resistance forming, at least in part, the variable on-resistance of the variable switch.

17. The method of claim 14 wherein the variable on-resistance of the variable switch is equal to a sum of a respective on-resistance of each of the plurality of FETs of the stack.

18. A mobile device including a switched attenuator comprising:

a radio frequency (RF) input;

an RF output; and an attenuation cell connected between the RF input and the RF output and including a variable switch with a variable on-resistance, the variable switch including a first field-effect transistor (FET) having a first independently trimmed periphery and a second FET having a second independently trimmed periphery different than the first independently trimmed periphery, each of the first and second FETs being a single FET, the variable switch being configured to fine-tune the variable on-resistance of the variable switch, the fine-tuning including enabling the first FET and disabling the second FET in a first mode of operation, and disabling the first FET and enabling the second FET in a second mode of operation.

19. The mobile device of claim 18 wherein the variable switch comprises a stack of a plurality of FETs, the plurality of FETs including at least one of the first FET and the second FET.

20. The mobile device of claim 19 wherein the variable on-resistance of the variable switch is equal to a sum of a respective on-resistance of each of the plurality of FETs of the stack.

* * * * *